(12) United States Patent
Yamaguchi et al.

(10) Patent No.: US 10,353,253 B2
(45) Date of Patent: Jul. 16, 2019

(54) MOUNTING SUBSTRATE AND DISPLAY DEVICE

(71) Applicant: Sharp Kabushiki Kaisha, Sakai, Osaka (JP)

(72) Inventors: Katsuhiro Yamaguchi, Sakai (JP); Nobuhiro Nakata, Sakai (JP); Yukinori Masuda, Sakai (JP); Tomoki Takahara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 44 days.

(21) Appl. No.: 15/543,014

(22) PCT Filed: Jan. 8, 2016

(86) PCT No.: PCT/JP2016/050444
§ 371 (c)(1),
(2) Date: Jul. 12, 2017

(87) PCT Pub. No.: WO2016/114227
PCT Pub. Date: Jul. 21, 2016

(65) Prior Publication Data
US 2018/0004030 A1 Jan. 4, 2018

(30) Foreign Application Priority Data

Jan. 16, 2015 (JP) ................................. 2015-006534

(51) Int. Cl.
*H01L 23/544* (2006.01)
*G02F 1/1345* (2006.01)
(Continued)

(52) U.S. Cl.
CPC ........... *G02F 1/13452* (2013.01); *G02B 5/20* (2013.01); *G02F 1/136286* (2013.01);
(Continued)

(58) Field of Classification Search
CPC ....... H01L 23/544; H01L 24/29; H01L 24/73; H01L 24/83; H01L 27/1218; G02F 1/13452; G02F 1/136286
See application file for complete search history.

(56) References Cited

U.S. PATENT DOCUMENTS 10,069,106 B2 * 9/2018 Choi ................... H01L 51/5253
2016/0190511 A1 * 6/2016 Choi ................... H01L 51/5253
257/40

FOREIGN PATENT DOCUMENTS

JP  2004-138700 A   5/2004
JP  2004-206605 A   7/2004
(Continued)

*Primary Examiner* — Andrew Q Tran
(74) *Attorney, Agent, or Firm* — ScienBiziP, P.C.

(57) ABSTRACT

An array substrate includes a glass substrate GS, an alignment mark 29, and first traces 19. The glass substrate GS has a corner portion 30 having an outline defined by a first edge portion 11*b*1 and a second edge portion 11*b*2 crossing the first edge portion 11*b*1. The alignment mark 29 is disposed at the corner portion 30 and used as the positioning index in mounting a driver 21 and a flexible printed circuit board 13. The alignment mark 29 at least includes first and second side portions 29*a*, 29*b* parallel to the first and second edge portions 11*b*1, 11*b*2, respectively. One end of the second side portion 29*b* is continuous to one end of the first side portion 29*a*. The alignment mark 29 has an outline that is on a same plane with a reference line BL connecting other ends of the first side portion 29*a* and the second side portion 29*b* linearly. The first traces 19 include inclined portions 31 that are inclined with respect to the first and second side portions 29*a*, 29*b* along the reference line BL.

13 Claims, 17 Drawing Sheets

(51) Int. Cl.
   G02B 5/20      (2006.01)
   H01L 51/50     (2006.01)
   G02F 1/1362    (2006.01)
   H01L 23/00     (2006.01)
   H01L 27/12     (2006.01)
   H05K 1/02      (2006.01)
   H05K 1/14      (2006.01)
   G02F 1/1368    (2006.01)

(52) U.S. Cl.
   CPC ............ *H01L 23/544* (2013.01); *H01L 24/29* (2013.01); *H01L 27/1218* (2013.01); *H01L 51/50* (2013.01); *H05K 1/0269* (2013.01); *H05K 1/147* (2013.01); *G02F 1/1368* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 27/124* (2013.01); *H01L 2223/54426* (2013.01); *H01L 2224/13144* (2013.01); *H01L 2224/16225* (2013.01); *H01L 2224/29355* (2013.01); *H01L 2224/29444* (2013.01); *H01L 2224/32225* (2013.01); *H01L 2224/73204* (2013.01); *H01L 2224/81132* (2013.01); *H01L 2224/81424* (2013.01); *H01L 2224/81447* (2013.01); *H01L 2224/81466* (2013.01); *H01L 2224/83132* (2013.01); *H01L 2224/83192* (2013.01); *H01L 2224/83203* (2013.01); *H01L 2224/83851* (2013.01); *H01L 2924/1426* (2013.01); *H05K 2203/166* (2013.01)

(56) References Cited

FOREIGN PATENT DOCUMENTS

JP    2007-273578 A      10/2007
KR    20160080994 A   *   7/2016   ............ H01L 27/32

* cited by examiner

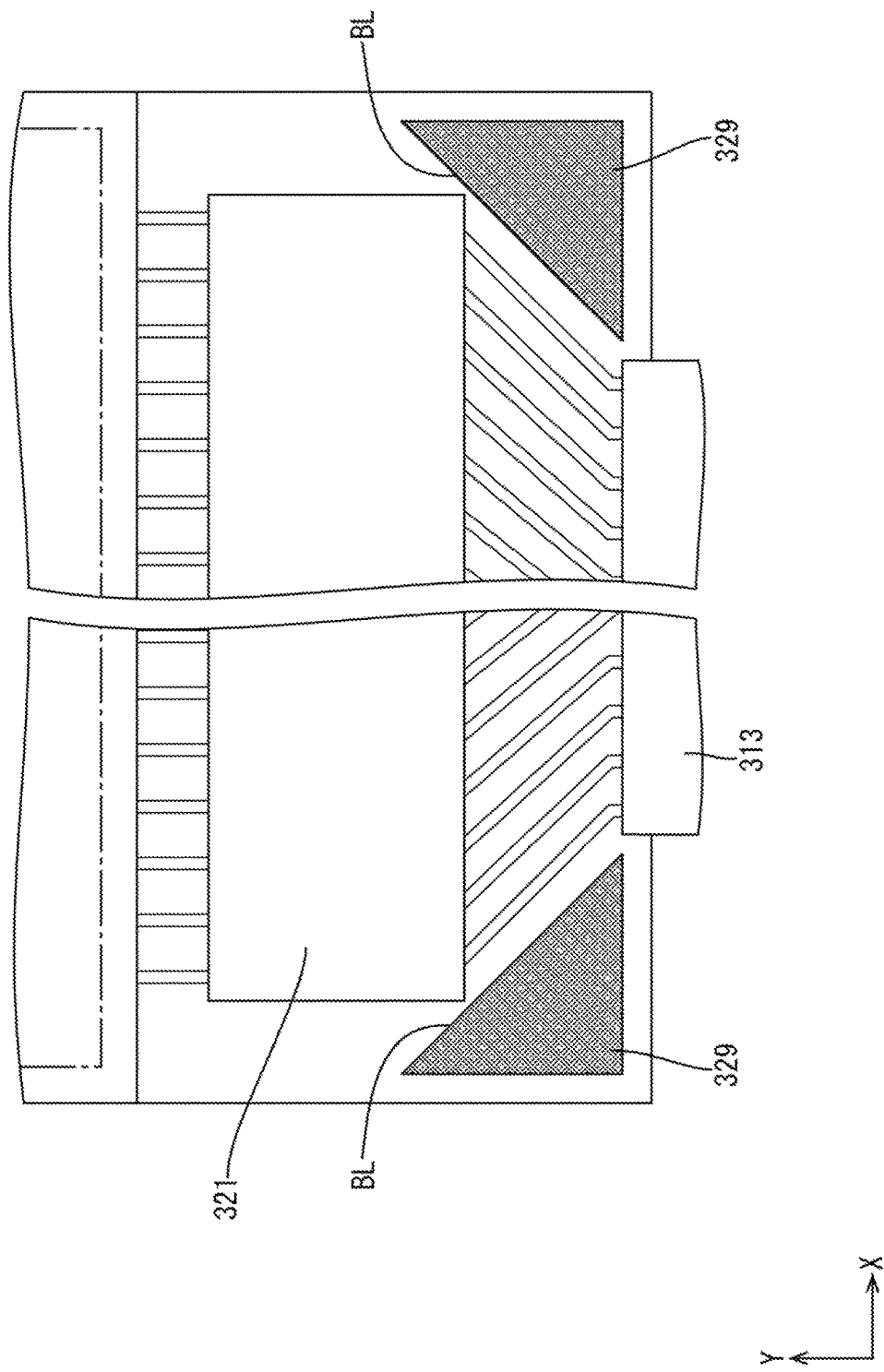

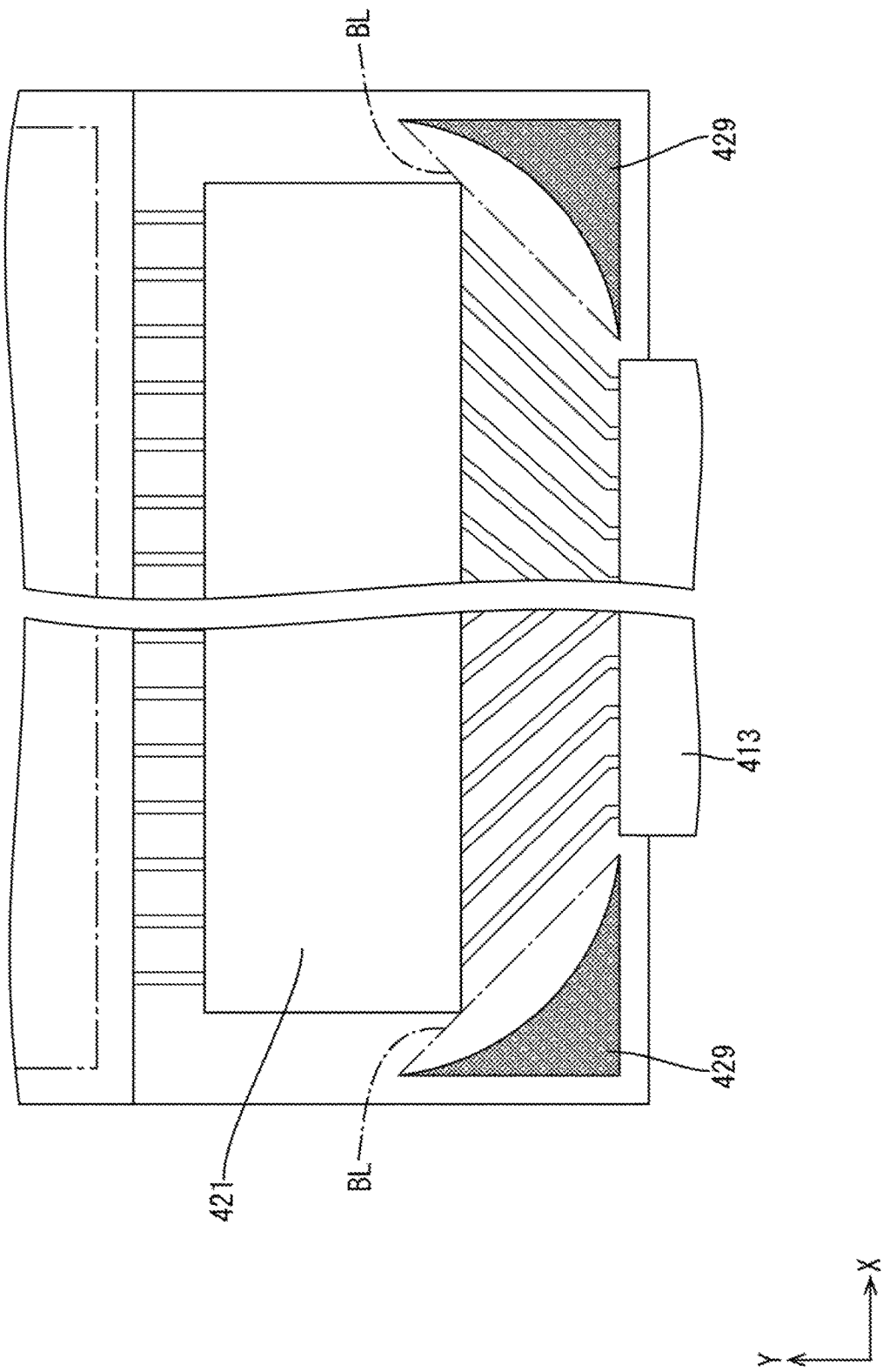

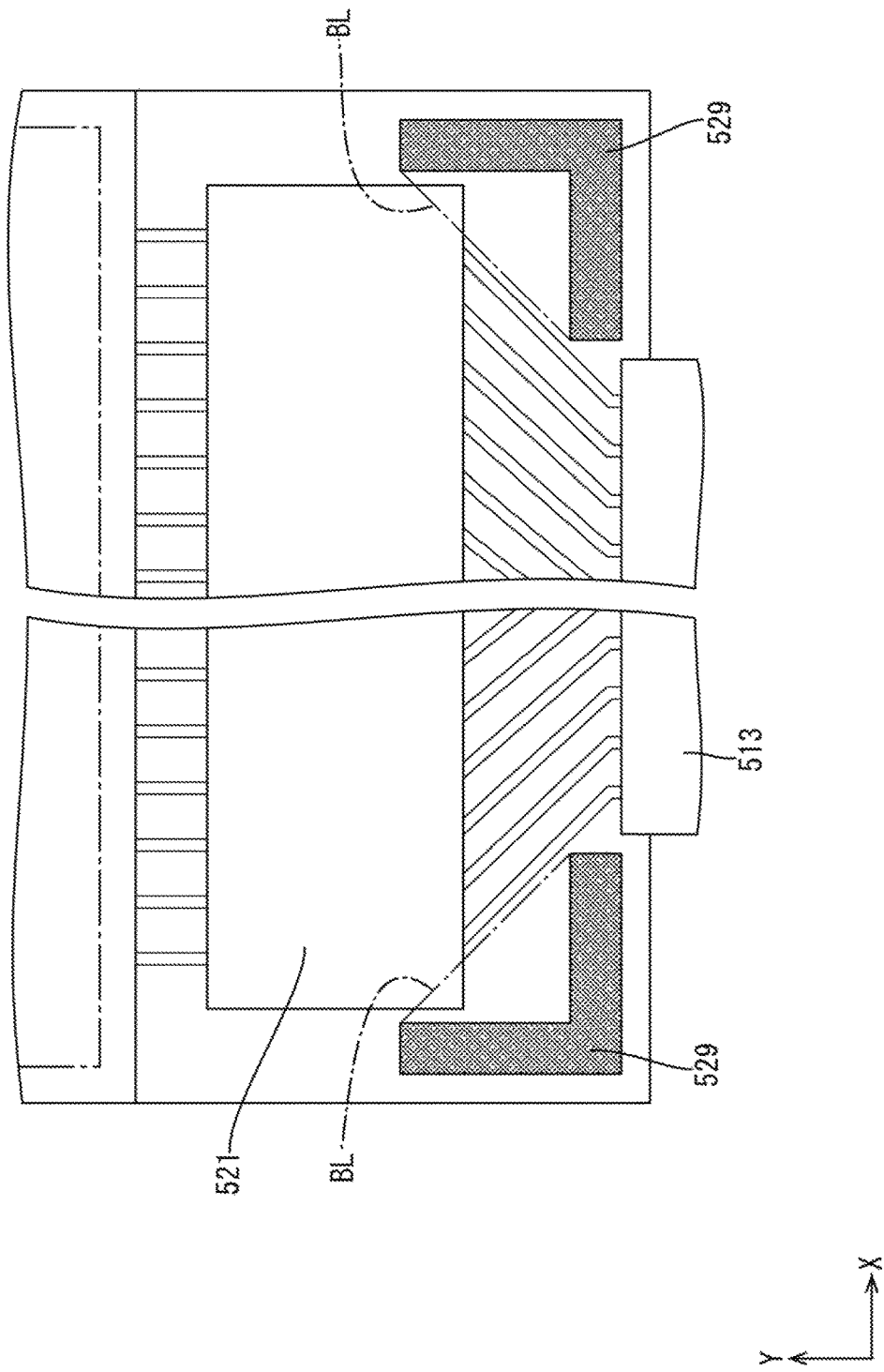

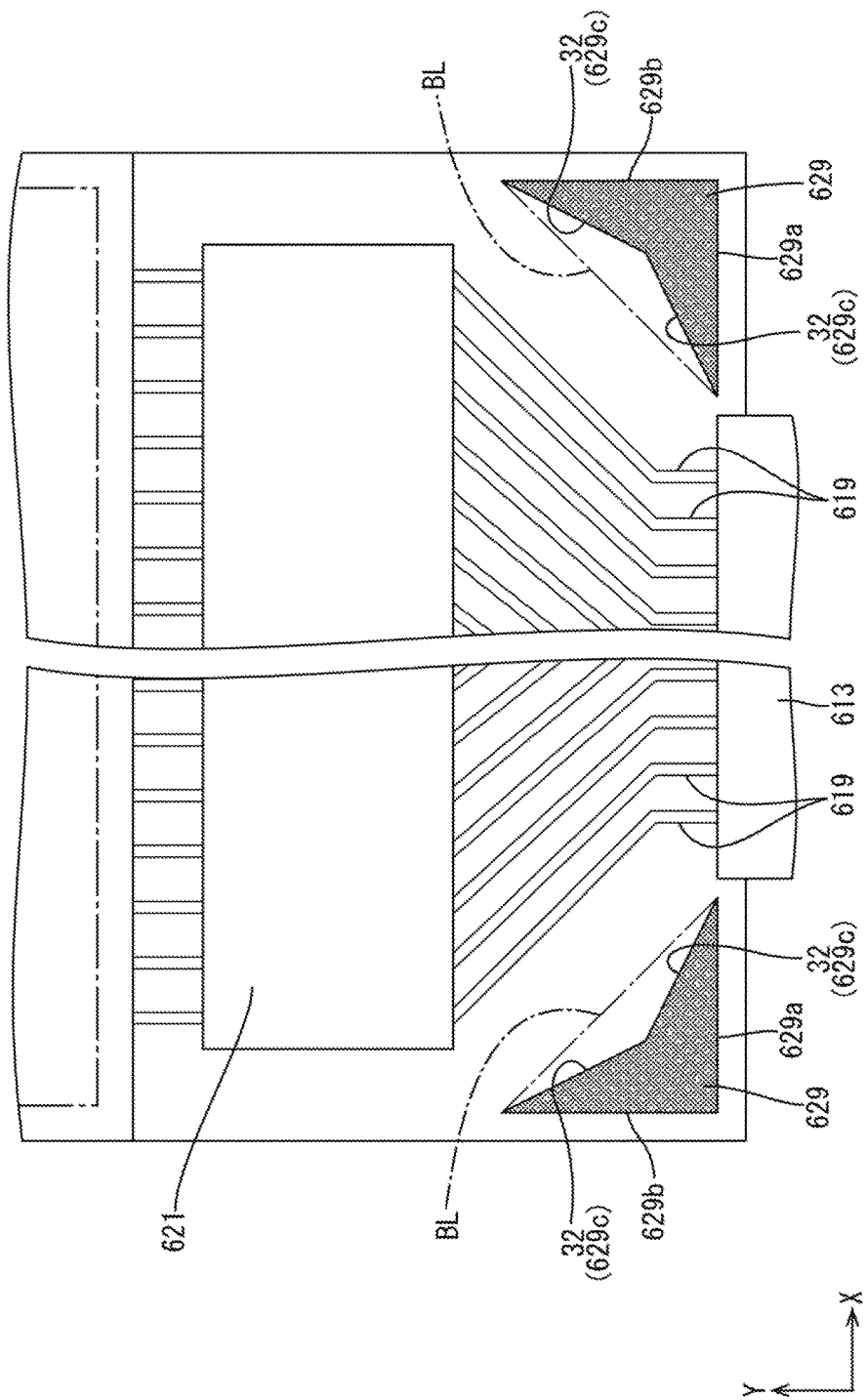

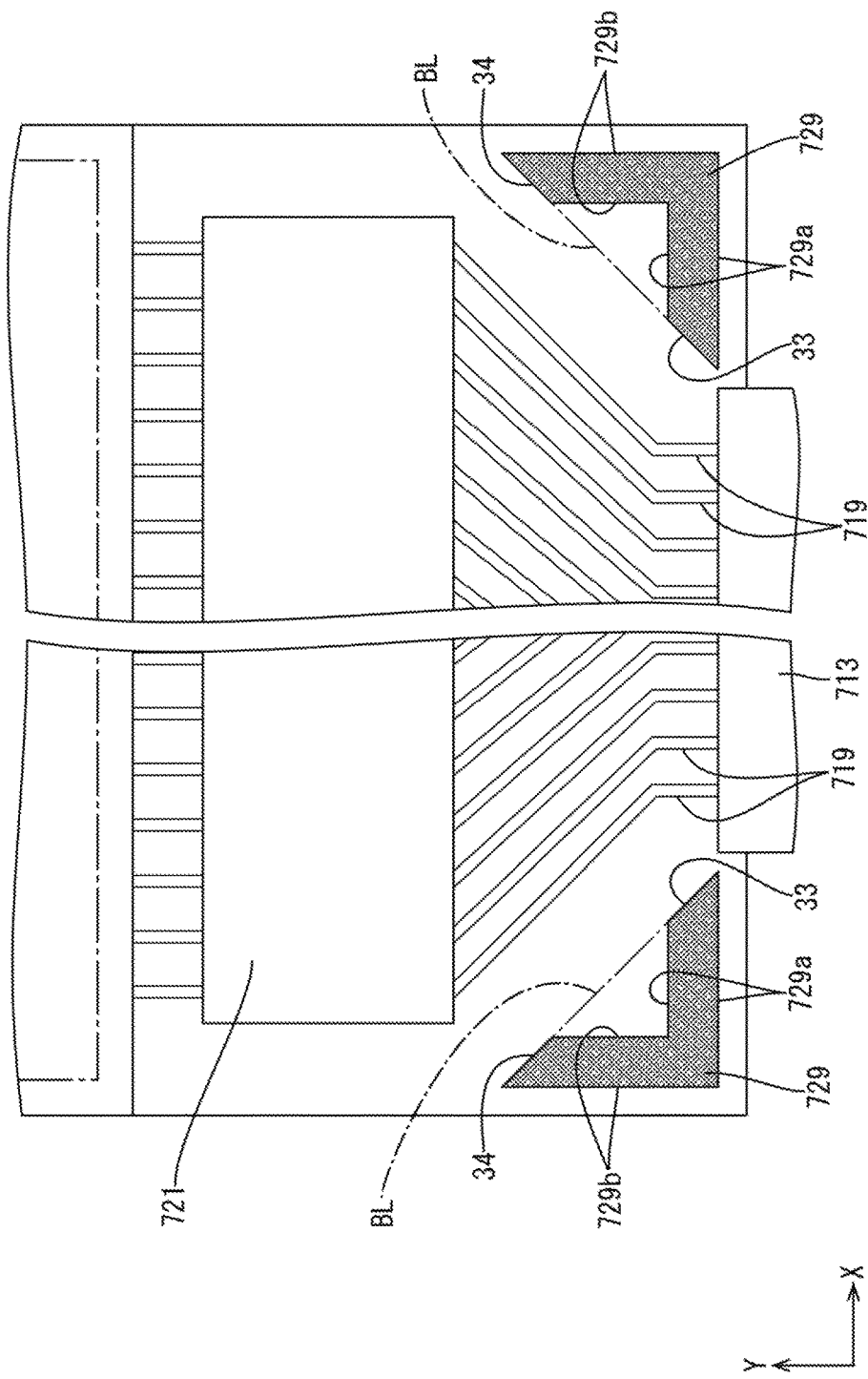

US 10,353,253 B2

MOUNTING SUBSTRATE AND DISPLAY DEVICE

TECHNICAL FIELD

The present invention relates to a mounting substrate and a display device.

BACKGROUND ART

A display panel including glass substrates in a liquid crystal display device or an organic EL display device includes two glass substrates that have certain compositions thereon and are bonded to each other with a certain clearance therebetween. An edge portion of such a display panel is connected to a flexible printed circuit board on which a drive circuit is mounted to receive supply of power voltage and display signals from external devices. An example of a configuration of connecting the flexible printed circuit board to the edge portion of the display panel is described in Patent document 1.

Patent document 1 describes an electronic component connection structure in which a first outer connection terminal disposed on a second transparent substrate is connected to a first connection terminal installed in a first FPC. The connection structure includes a first alignment mark formed on a first surface of the second transparent substrate having the first outer connection terminal and made of ITO, and an auxiliary mark formed on a second surface of the second transparent substrate and made of an opaque film. The second surface is a rear surface side of the first surface. The auxiliary mark corresponds to the first alignment mark.

RELATED ART DOCUMENT

Patent Document

Patent Document 1: Japanese Unexamined Patent Application Publication No. 2007-273578

Problem to be Solved by the Invention

However, according to decrease in the frame width of the display panel, it may be difficult to keep a space for mounting the flexible printed circuit board, the terminal portions and the trace portion connected to the flexible printed circuit board and a space for disposing an alignment mark. Therefore, it is difficult to dispose the auxiliary mark in addition to the first alignment mark as described in Patent Document 1. Further, if the frame width is reduced and the definition of the display panel is enhanced, it is more difficult to keep the above spaces.

DISCLOSURE OF THE PRESENT INVENTION

The technology disclosed herein was made in view of the above circumstances. An object is to reduce a frame width.

Means for Solving the Problem

A mounting substrate according to the present technology includes a substrate on which mounting components are to be mounted, the substrate including a corner portion having an outline defined by a first edge portion and a second edge portion that crosses the first edge portion, an alignment mark disposed on the corner portion and that is an index for positioning when mounting the mounting components, the alignment mark including at least a first side portion parallel to the first edge portion and a second side portion parallel to the second edge portion, the first side portion having one end and another end, and the second side portion having one end that is continuous to the one end of the first side portion, the second side portion further having another end, the alignment mark having a reference line connecting the other ends of the first side portion and the second side portion linearly and having an outline that is on a same plane as the reference line or recessed from the reference line, and traces to be connected to the mounting component, the traces including inclined portions inclined along the reference line and inclined with respect to the first side portion and the second side portion.

The substrate on which the mounting components are mounted includes the corner portions each having an outline defined by the first edge portion and the second edge portion that crosses the first edge portion. The alignment mark is disposed on each of the corner portions and the alignment mark includes at least the first side portion parallel to the first edge portion and the second side portion parallel to the second edge portion and one end of the second side portion is continuous to one end of the first side portion. With such a configuration, the alignment mark can be disposed closer to the first edge portion and the second edge portion compared to a configuration that the alignment mark includes the side portions that are not parallel to the respective edge portions. Therefore, a space required for arranging the alignment mark is reduced and accordingly, a space in which the mounting components and the traces can be mounted is increased. Further, the alignment mark has an outline that is on a same plane as the reference line that connects the other ends of the respective first side portion and the second side portion linearly or an outline that is recessed from the reference line. Therefore, compared to a configuration that the alignment mark has an outline projecting from the reference line, the space required for arranging the alignment mark is reduced and accordingly, the space in which the mounting components and the traces can be mounted is increased. The traces include at least the inclined portions that are inclined with respect to the first side portion and the second side portion along the reference line. Therefore, the traces can be arranged effectively in the space that is prepared by the above configuration of the alignment mark, and it is effective in a configuration that the number of the traces is increased. Thus, the space for arranging the mounting components and the traces can be effectively increased and it is preferable to reduce a frame width of the mounting substrate and also preferable in a configuration that the amount of signals transmitted with the mounting components and the traces is greatly increased.

The mounting substrate of the present technology may include following configurations.

(1) The alignment mark may have the outline that is on the same plane as the reference line.

According to such a configuration, the reference line is clearly represented by the outline of the alignment mark.

(2) The corner portion may have the outline defined by the first edge portion and the second edge portion that are perpendicular to each other, and the alignment mark may have a right triangular plan view shape. According to such a configuration, the space for arranging the alignment mark at the corner portion can be further reduced.

(3) The alignment mark may have the outline recessed from the reference line. According to such a configuration, the space for arranging the mounting components and the traces can be increased by the recessed amount of the outline of the alignment mark from the reference line. Therefore, it is preferable for reducing a frame width and increasing the amount of signals.

(4) The outline of the alignment mark may have a recessed portion recessed from the reference line and the recessed portion may have an arched plan view shape. According to such a configuration, the alignment mark tapers toward the respective other ends of the first side portion and the second side portions, and the space for arranging the mounting components and the traces can be increased. Therefore, it is preferable for reducing a frame width and increasing the amount of signals.

(5) The outline of the alignment mark may have a recessed portion recessed from the reference line and the recessed portion may include the first side portion and the second side portion. According to such a configuration, the outline of the alignment mark is recessed at most from the reference line and the space for arranging the mounting components and the traces can be increased. Therefore, such a configuration is preferable for reducing a frame width and increasing the amount of signals.

(6) A part of the traces or a part of the mounting component may be overlapped with the reference line. According to such a configuration, an arrangement space is increased by the outline of the alignment mark recessed from the reference line and the increased arrangement space is effectively used. Therefore, such a configuration is preferable for reducing a frame width and increasing the amount of signals.

(7) The alignment mark may be configured such that the first side portion has a length that is equal to a length of the second side portion. According to such a configuration, the arrangement space of the alignment mark can be isotropic.

(8) The alignment mark may be configured such that a distance between the first edge portion and the first side portion is equal to a distance between the second edge portion and the second side portion. According to such a configuration, the arrangement space of the alignment mark can be isotropic.

(9) The second edge portion may include second edge portions in a pair and the corner portion of the substrate may include corner portions in a pair and the corner portions may have outlines defined by the first edge portion commonly and each of the second edge portions in a pair, and the alignment mark may include alignment marks in a pair that are disposed on the corner portions in a pair, respectively. According to such a configuration, the alignment marks in a pair are disposed on the respective corner portions in a pair that have the outlines defined by the common first edge portion and the pair of the second edge portions. Therefore, the mounting components are mounted with high alignment accuracy and mounting errors are less likely to be caused.

(10) The mounting component may be a flexible printed circuit board that is mounted on the substrate. According to such a configuration, the flexible printed circuit board can be mounted on the substrate with high alignment accuracy by the alignment marks.

(11) Driven elements may be disposed on the substrate, and the mounting component may be a drive circuit portion that drives the driven elements. According to such a configuration, the drive circuit portion can be mounted on the substrate with high alignment accuracy by the alignment marks.

Next, to solve the above problems, a display device according to the present technology may include the above mounting substrate and a counter substrate bonded on the mounting substrate such that a plate surface of the counter substrate is opposite a plate surface of the mounting substrate. The display device having such a configuration is preferable to reduce the frame width and enhance definition.

Advantageous Effect of the Invention

According to the present invention, a frame width is reduced.

BRIEF DESCRIPTION OF THE DRAWINGS

FIG. 8 is a cross-sectional view illustrating a substrate before the driver is mounted on.

FIG. 9 is a cross-sectional view illustrating a substrate before the flexible printed circuit board is mounted on.

FIG. 13 is an enlarged plan view illustrating corner portions of an array substrate according to a fourth embodiment of the present technology.

FIG. 14 is an enlarged plan view illustrating corner portions of an array substrate according to a fifth embodiment of the present technology.

FIG. 15 is an enlarged plan view illustrating corner portions of an array substrate according to a sixth embodiment of the present technology.

FIG. 16 is an enlarged plan view illustrating corner portions of an array substrate according to a seventh embodiment of the present technology.

FIG. 17 is an enlarged plan view illustrating corner portions of an array substrate according to an eighth embodiment of the present technology.

MODE FOR CARRYING OUT THE INVENTION

<First Embodiment>

Figure 1:
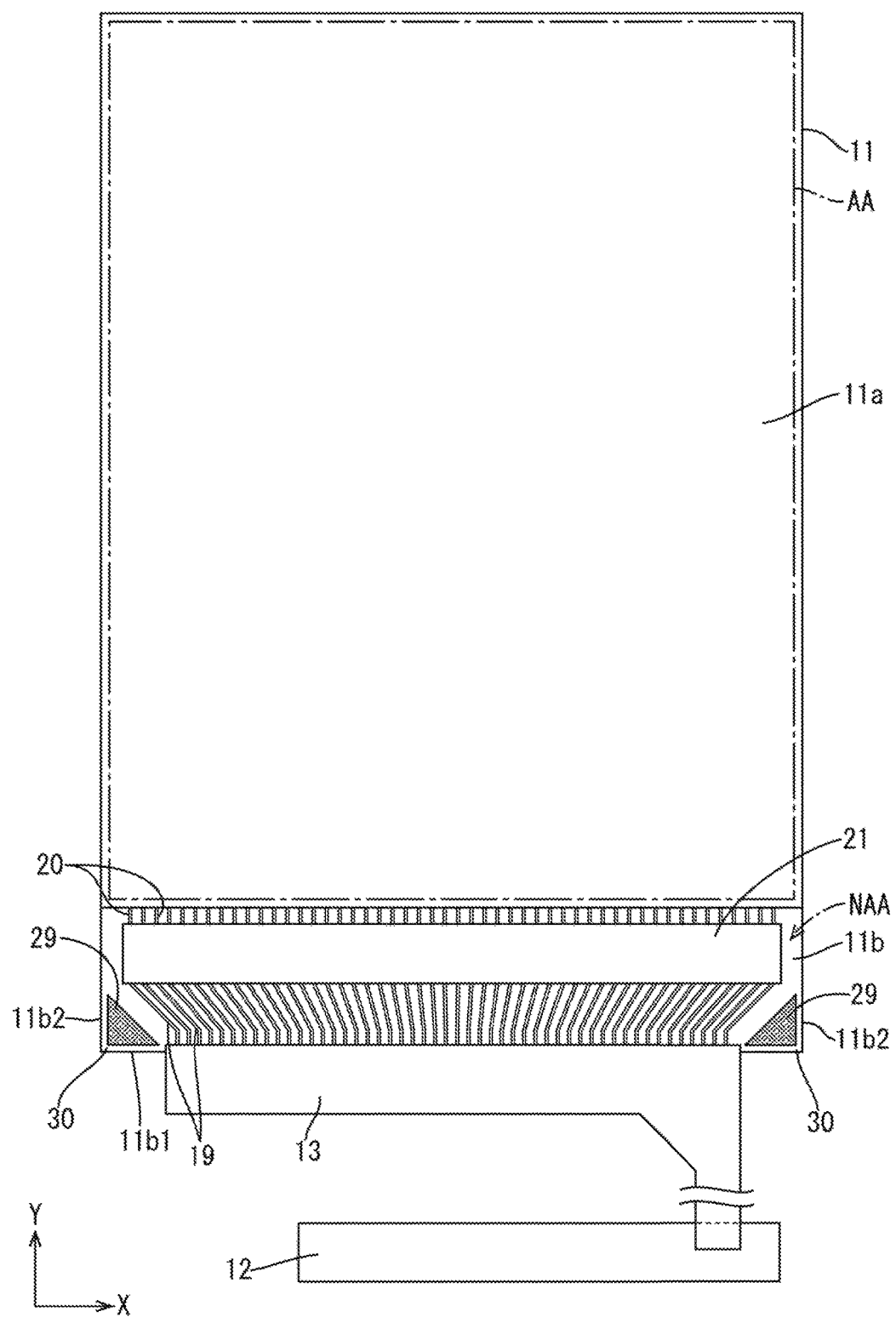
FIG. 1 is a plan view illustrating a general connection configuration of a flexible printed circuit board and a liquid crystal panel on which a driver is mounted.

A first embodiment will be described with reference to FIGS. 1 to 10. In the present embodiment, an array substrate (a mounting substrate) 11b included in a liquid crystal panel (a display device) 11 of a liquid crystal display device 10 will be described. X-axis, Y-axis and Z-axis may be indicated in some of the drawings. The axes in each drawing correspond to the respective axes in other drawings. A vertical direction in FIGS. 2, 3, 5, 6, 9 and 10 is a reference vertical direction and an upper side and a lower side in the drawings are a front side and a rear side, respectively.

Figure 2:
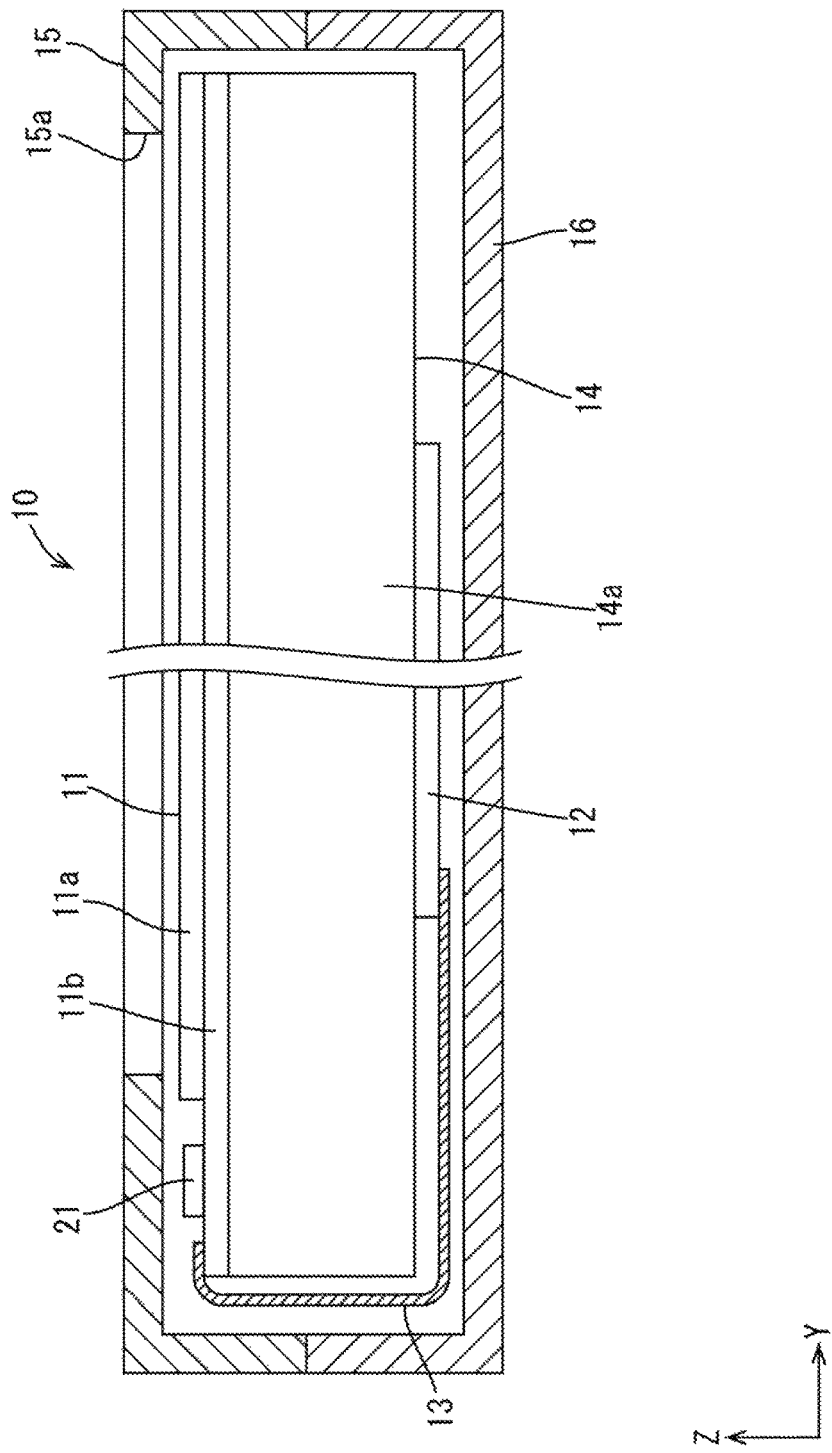
FIG. 2 is a cross-sectional view illustrating a cross-sectional configuration of a liquid crystal display device taken in a long-side direction.

As illustrated in FIGS. 1 and 2, the liquid crystal display device 10 includes a liquid crystal panel 11, a driver (a mounting component, a drive circuit portion) 21 that is mounted on and drive the liquid crystal panel 11, a control circuit board (an external signal supply source) 12 that supplies input signals from outside to the driver 21, a flexible printed circuit board (a mounting component) 13 that electrically connects the liquid crystal panel 11 and the external control circuit board 12, and a backlight device (a lighting device) 14 that provides light toward the liquid crystal panel 11 for displaying images. The liquid crystal display device 10 further includes a pair of front and rear outer casing members 15, 16. The front and rear outer casing members 15, 16 are connected to each other and the liquid crystal panel 11 and the backlight device 14 are arranged and maintained inside the outer casing members 15, 16. The front-side outer casing member 15 has an opening hole 15a through which an image on the liquid crystal panel 11 can be seen from outside. The liquid crystal display device 10 according to this embodiment is used in electronic devices (not illustrated) such as mobile information terminals (including electronic book and PDA), mobile phones (including smart phones), laptop computers (including tablet-type laptop computers), a digital photo frame, portable video game players, and electronic ink paper. The liquid crystal display device 10 may be used in other devices. The display size of the liquid crystal panel 11 included in the liquid crystal display device 10 is from several inches to a dozen inches. Namely, the liquid crystal panel 11 is generally classified as a small sized or a medium sized panel. The display size is not limited thereto.

The backlight device 14 will be simply described. As illustrated in FIG. 2, the backlight device 14 includes a chassis 14a that has a substantially box-shape opening toward the front side (the liquid crystal panel 1 side), a light source (not illustrated) arranged in the chassis 14a (for example, a cold cathode tube, a LED, organic EL), and an optical member (not illustrated) provided to cover the opening of the chassis 14a. The optical member converts light emitted by the light source into a planar light.

Next, the liquid crystal panel 11 will be described. As illustrated in FIG. 1, the liquid crystal panel 11 has a rectangular and vertically long overall shape. The liquid crystal panel 11 includes a display area (an active area) AA closer to one edge portion in a long-side dimension (an upper side in FIG. 1) and includes a driver 21 and a flexible printed circuit board 13 closer to another edge portion in the long-side dimension (a lower side in FIG. 3). Images appear on the display area AA. The liquid crystal panel 11 further includes a non-display area (a non-active area) NAA other than the display area AA. No images appear on the non-display area NAA and a part of the non-display area NAA is a mount area where the driver 21 and the flexible printed circuit board 22 are mounted. A short-side direction of the liquid crystal panel 11 corresponds with the X-axis direction in each drawing and a long-side direction corresponds with the Y-axis direction. In FIG. 1, a frame-shaped alternate long and short dashed line that is smaller than the size of a CF substrate 11a represents an outer shape of the display area AA and an area outside the alternate long and short dashed line is non-display area NAA.

Figure 3:
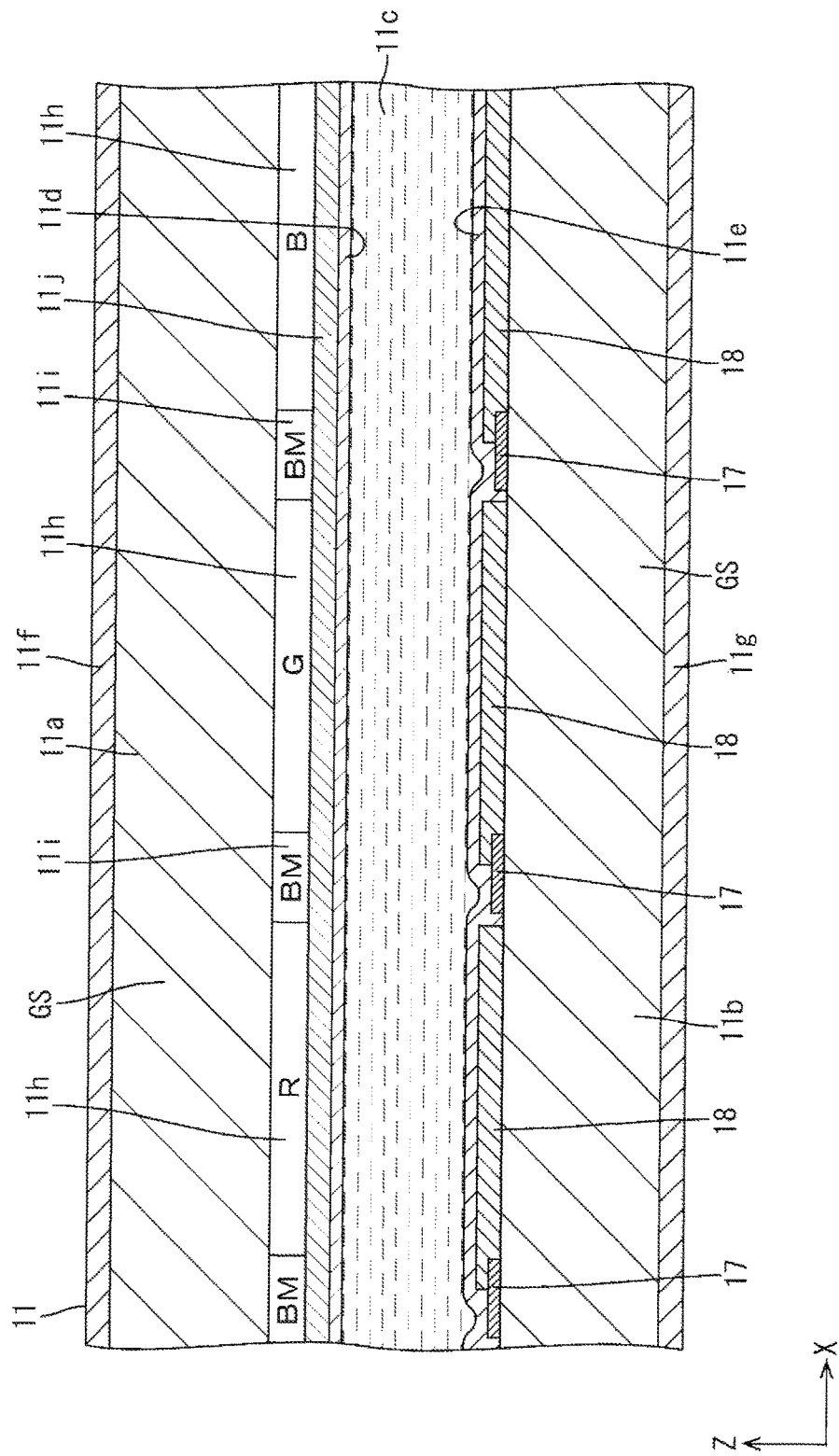
FIG. 3 is a cross-sectional view illustrating a cross-sectional configuration of the liquid crystal panel.

As illustrated in FIG. 3, the liquid crystal panel 11 includes a pair of substrates 11a, 11b, and a liquid crystal layer 11c between the substrates 11a and 11b. The liquid crystal layer 11c includes liquid crystal molecules having optical characteristics that vary according to application of electric field. The substrates 11a and 11b are bonded together with a sealing agent, which is not illustrated, with a gap therebetween. The gap corresponds to a thickness of the liquid crystal layer 11c. Each of the substrates 11a, 11b is a substantially transparent (highly transmissive) glass substrate (substrate) GS made of alkali-free glass or quartz glass, and multiple layers are layered on each glass substrate with a known photolithography method. One of the substrates 11a, 11b on the front (a front-surface side) is a CF substrate (a counter substrate) 11a and the other one of the substrates 11a, 11b on the rear (a rear-surface side) is an array substrate (a mounting substrate, a component substrate, an active matrix board) 11b. As illustrated in FIGS. 1 and 2, a short dimension of the CF substrate 11a is substantially the same as that of the array substrate 11b and a long dimension of the CF substrate 11a is substantially smaller than that of the array substrate 11b. The CF substrate 11a is bonded to the array substrate 11b with one of edges of the short dimension of the CF substrate 11a (the upper edge in FIG. 1) aligned with one of edges of the array substrate 11b. Therefore, a portion of the array substrate 11b closer to the other one of the edges thereof (the lower edge in FIG. 1) does not overlap the CF substrate 11a, that is, front and back surfaces of the portion are uncovered. The mounting section for the drivers 21 and the flexible printed circuit board 13 is allocated in this portion. The glass substrate GS of the array substrate 11b includes a substrate main portion GSm that is overlapped with the CF substrate 11a with a plan view and a substrate side portion GSs that is on a side of the substrate main portion GSm and is not overlapped with the CF substrate 11a with a plan view. Polarizing plates (optical member) 11f, 11g are bonded to outer surfaces of the substrates 11a, 11b, respectively. The rear-side polarizing plate 11g on the outer surface of the array substrate 11b is overlapped with the substrate main portion GSm over an entire area thereof and is disposed next to the substrate side portion GSs with respect to the Y-axis direction. The front-side polarizing plate 11f on the outer surface of the CF substrate 11a is disposed similarly to the rear-side polarizing plate 11g. Alignment films 11d, 11e are formed on inner surfaces of the substrates 11a, 11b, respectively, for aligning liquid crystal molecules in the liquid crystal layer 11c.

Next, configurations of the array substrate 11b and the CF substrate 11a inside the display area AA will be described in detail. As illustrated in FIG. 3, a large number of thin film transistors (TFTs, a driven element, a display element) 17 and a large number of pixel electrodes 18 are arranged in a matrix on the inner surface of the array substrate 11b (a surface facing the liquid crystal layer 11c and the CF substrate 11a). The TFTs 17 are switching components. Gate lines and source lines (not illustrated) are arranged in a matrix around the TFTs 17 and the pixel electrodes 18. Namely, the TFTs 17 and the pixel electrodes 18 are arranged in rows and columns in a crossing area defined by the gate lines and the source lines crossing each other. The gate lines and the source lines are connected to gate electrodes and source electrodes of the TFTs 17, respectively. The pixel electrodes 18 are connected to drain electrodes of the TFTs 17. The gate lines and the source lines are made of a metal film including metal material such as titanium, copper, and aluminum that is processed with patterning. The pixel electrode 18 has a portrait shape (a rectangular shape) in a plan view. The pixel electrode 18 is made of transparent conductive film including transparent and conductive materials such as indium tin oxide (ITO) or zinc oxide (ZnO) and processed with patterning. Capacitance lines (not illustrated) may be arranged on the array substrate 11b, parallel to the gate lines 19 and crossing the pixel electrodes 18.

As illustrated in FIG. 3, the CF substrate 11a includes a color filter 11h. The color filter 11h includes a large number of color sections colored in red (R), green (G), and blue (B). The color sections are arranged in a matrix and overlap the pixel electrodes 18 disposed on the array substrate 11b in a plan view. A light blocking layer (a black matrix) 11i is arranged between the color sections of the color filter 11h. The light blocking layer 11i has a function of reducing color mixing. The light blocking layer 11i is disposed corresponding to the gate lines and the source lines in a plan view. Counter electrodes 11j are arranged on surfaces of the color filter 11h and the light blocking layer 11i. The counter electrodes 11j are opposite the pixel electrodes 18 on the array substrate 11b side. In the liquid crystal panel 11, color sections of three colors including red (R), green (G), and blue (B) and three pixel electrodes 18 opposite the respective three color sections configure one display pixel that is a display unit. The display pixel includes a red pixel having a red R color section, a green pixel having a green G color section, and a blue pixel having a blue B color section. The color pixels of three colors are arranged on a plate surface of the liquid crystal panel 11 in a row direction (the X-axis direction) sequentially in a repeated manner and configure a pixel group. Multiple pixel groups are arranged in the column direction (the Y-axis direction).

Next, the components connected to the liquid crystal panel 11 will be described. As illustrated in FIGS. 1 and 2, the control circuit board 12 is attached to the back surface of the chassis 14a of the backlight device 14 (an outer surface on a side opposite from the liquid crystal panel 11 side) with a screw or other fixing member. The control circuit board 12 includes a substrate made of paper phenol or glass epoxy resin and electronic components mounted on the substrate for supplying various kinds of input signals to the driver 21. The control circuit board 12 further includes predetermined traces (conductive lines), which are not illustrated, routed on the substrate. One of ends (one end side) of the flexible printed circuit board 13 is electrically and mechanically connected to the control circuit board 12 via an anisotropic conductive member, which is not illustrated.

As illustrated in FIGS. 1 and 2, the flexible printed circuit board (FPC board) 13 includes a base member made of synthetic resin (e.g., polyimide resin) having an insulating property and flexibility. The flexible printed circuit board 13 includes traces (not illustrated) on the base member. As described earlier, one edge portion of the flexible printed circuit board with respect to the length direction thereof is connected to the control circuit board 12 on the back surface of the chassis 14a. The other edge portion (another edge side) of the flexible printed circuit board 13 is connected to the array substrate 11b of the liquid crystal panel 11. Namely, the flexible printed circuit board 13 is folded such that a shape in a cross-sectional view is a U-like shape. The edge portions of the flexible printed circuit board 13 with respect to the length direction include exposed portions of traces which form terminals (not illustrated). The terminals are electrically connected to the control circuit board 12 and the liquid crystal panel 11. According to the configuration, the input signals supplied by the control circuit board 12 are transmitted to the liquid crystal panel 11.

As illustrated in FIG. 1, the driver 21 includes an LSI chip including a driver circuit therein. The driver 21 operates according to signals supplied by the control circuit board 12, which is a signal source, process the input signals supplied by the control circuit board 12, which is a signal source, generates output signals, and sends the output signals to the display area AA of the liquid crystal panel 11. The driver 21 has a horizontally long rectangular shape in the plan view. The driver 21 is orientated such that a long-side direction thereof is along the long-side direction of the liquid crystal panel 11. The driver 21 is directly mounted on the substrate side portion GSs that is the non-display area NAA of the array substrate 11b in the liquid crystal panel 11 with the COG (chip on glass) mounting technology. The long side direction (elongated direction) of the driver 21 matches the X-axis direction (the short-side direction of the liquid crystal panel 11) and the short-side direction of the driver 21 matches the Y-axis direction (the long-side direction of the liquid crystal panel 11).

Next, a connection configuration of the flexible printed circuit board 13 and the driver 21 that are connected to the non-display area NAA of the array substrate 11b will be described. As illustrated in FIG. 1, the driver 21 and another edge portion of the flexible printed circuit board 13 (edge portion opposite from the control circuit board 12 side) are mounted on the substrate side portion GSs of the non-display area NAA of the array substrate 11b. The substrate side portion GSs is not overlapped with the CF substrate 11a. The other edge portion of the flexible printed circuit board 13 is arranged on an edge portion of the substrate side portion GSs opposite side from the substrate main portion GSm side (a display area AA side) with respect to the Y-axis direction. The driver 21 is arranged on the substrate side portion GSs closer to the substrate main portion GSm (closer to the display area AA) than the flexible printed circuit board 13. Namely, the driver 21 is arranged in the non-display area NAA and between the display area AA and the flexible printed circuit board 13. The other edge portion of the flexible printed circuit board 13 (to be mounted on the liquid crystal panel 11) is on an opposite side from the display area AA with respect to the driver 21 (on an edge portion of the array substrate 11b). The other edge portion of the flexible printed circuit board 13 is mounted on a middle portion in a short-side edge portion of the array substrate 11b. The mounted edge portion of the flexible printed circuit board 13 extends along the short-side edge of the array substrate 11b (the short-side direction, the X-axis direction). A dimension of the edge portion of the flexible printed circuit board 13 mounted on the array substrate 11b is smaller than a short-side dimension of the array substrate 11b. The driver 21 is mounted in a middle portion of the substrate side portion GSs with respect to the short-side direction of the array substrate 11b such that the long-side direction of the driver 21 corresponds with the short-side direction of the array substrate 11b (the X-axis direction). The long-side dimension of the driver 21 is greater than a dimension of the edge portion of the flexible printed circuit board that is mounted on the array substrate 11b.

Figure 4:
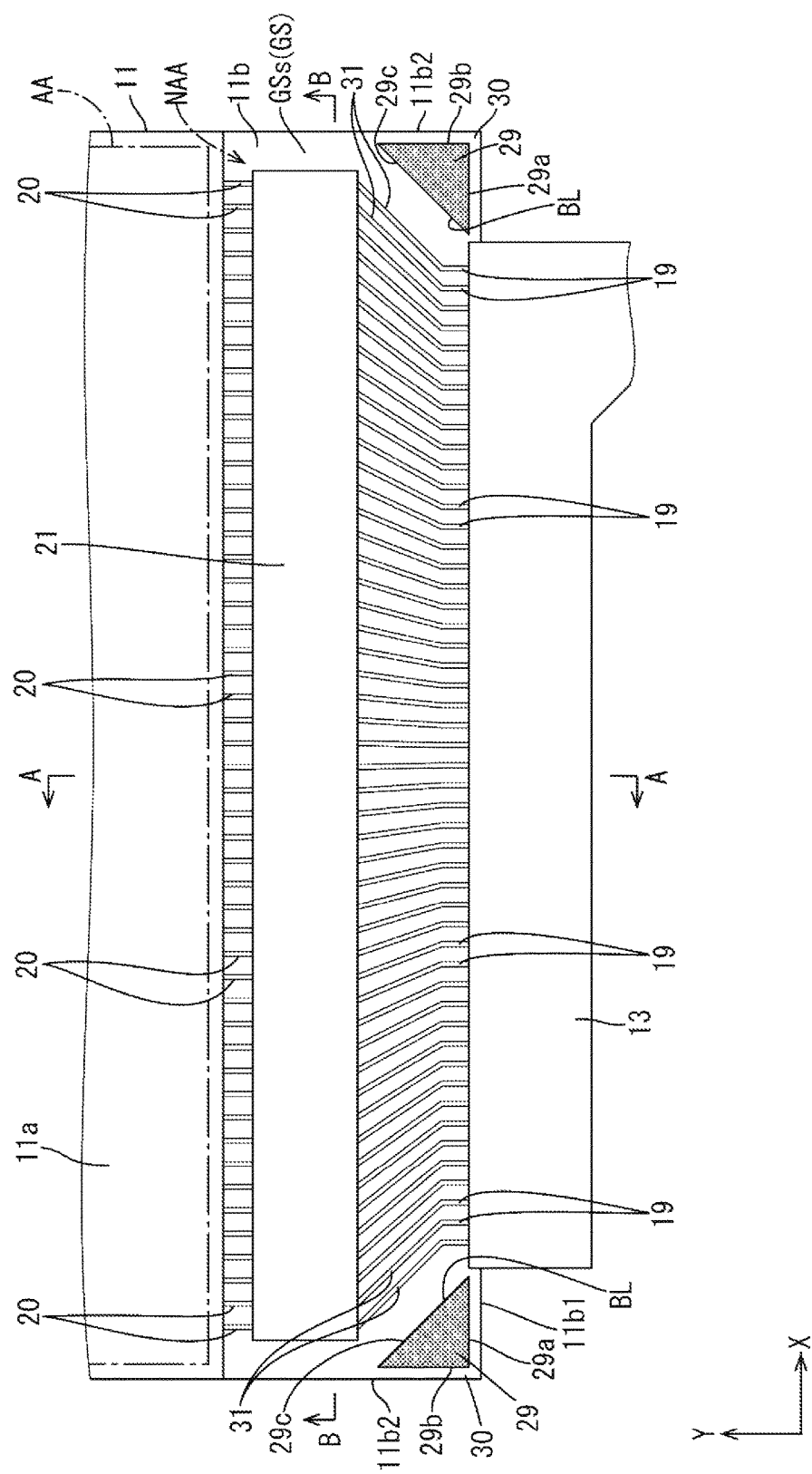
FIG. 4 is a plan view illustrating a part of the liquid crystal panel on which a driver and the flexible printed circuit board are mounted.
Figure 5:
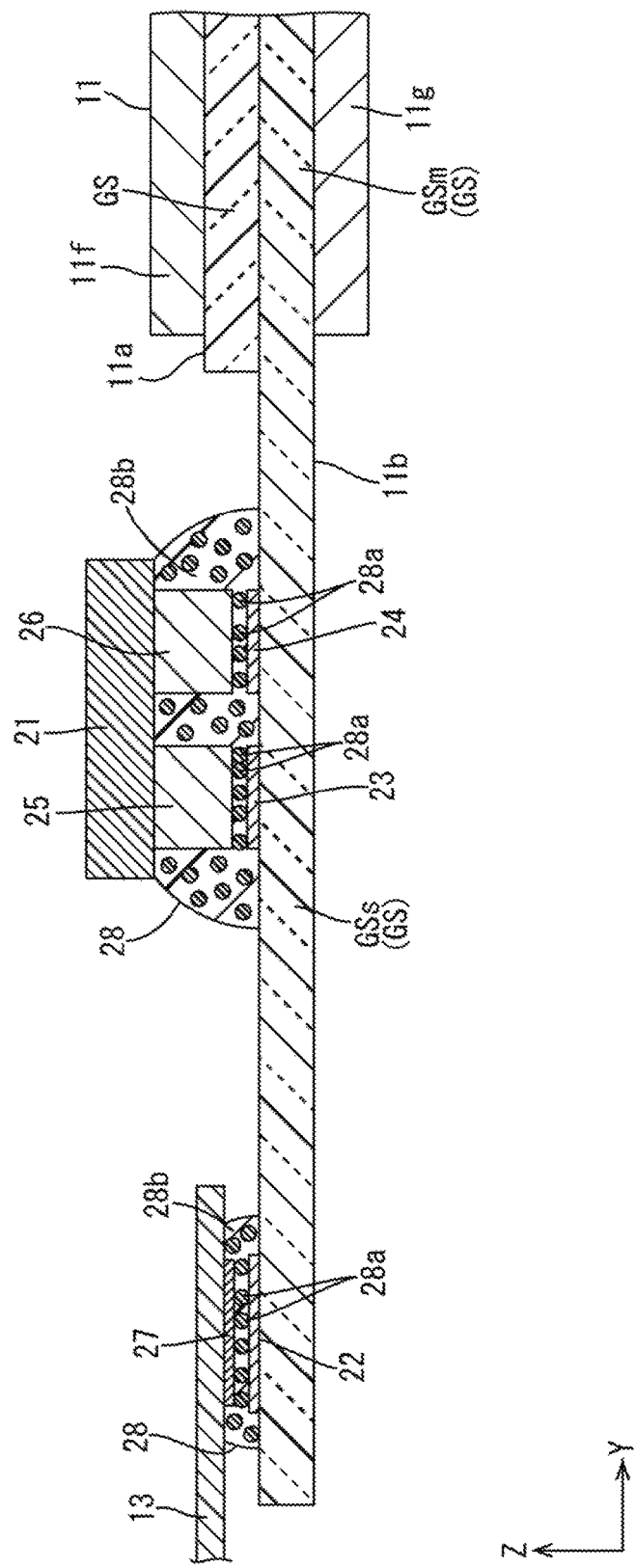
FIG. 5 is a cross-sectional view taken along line A-A in FIG. 4.

As illustrated in FIGS. 4 and 5, connection terminals 22 to 24 and traces 19, 20 that are connected to the connection terminals 22 to 24 are formed on the substrate side portion GSs of the glass substrate GS of the array board 11b. The connection terminals 22 to 24 are connected to the flexible printed circuit board 13 and the driver 21. As illustrated in FIG. 5, the connection terminals 22 to 24 includes an external connection terminals (flexible printed circuit board terminals) 22, panel-side input terminals (substrate-side input terminals, driver input terminals) 23, and panel-side output terminals (substrate side output terminals, driver output terminals) 24. The external connection terminals 22 are arranged in a flexible printed circuit board 13 mount area of the substrate side portion GSs and receive supply of input signals from the flexible printed circuit board 13. The panel-side input terminals 23 are mounted in the mounting area of the array substrate 11b in which the driver 21 is to be mounted. Input signals are supplied from the panel-side input terminals 23 to the driver 21. The panel-side output terminals 24 are mounted in the mounting area of the array substrate 11b in which the driver 21 is to be mounted. Output signals from the driver 21 are supplied to the panel-side output terminals 24. As illustrated in FIG. 4, the traces 19, 20 include first traces (mounting components relay traces) 19 and second traces (driven element mounting components relay traces) 20. The first traces 19 are arranged in the substrate side portion GSs and extend between the flexible printed circuit board 13 mounting area and the driver 21 mounting area, and the external connection terminals 22 and the panel-side input terminals 23 are electrically connected to each other via the first traces 19. The second traces 20 are arranged in the substrate side portion GSs and extend between the driver 21 mounting area and the display area AA, and the panel-side output terminals 24 and the gate lines and source lines (TFTs 17) within the display area AA are electrically connected to each other via the second traces 20. The first traces 19 and the second traces 20 are directly or indirectly connected to the driver 21 and the flexible printed circuit board 13, which are mounting components. In FIG. 4, a chain line indicates an outer boundary of the display area AA and the area outside the chain line is the non-display area NAA.

As illustrated in FIG. 5, the driver 21 includes driver-side input terminals (mounting component-side input terminals) 25 and driver-side output terminals (mounting component-side output terminals) 26. The driver-side input terminals 25 are electrically connected to the panel-side input terminals 23, and the driver-side output terminals 26 are electrically connected to the panel-side output terminals 24. The flexible printed circuit board 13 includes a flexible printed circuit board side terminals (mounting component-side terminals) 27 that are electrically connected to the external connection terminals 22.

As illustrated in FIG. 5, each of the terminals 22 to 24 of the array substrate 11a is made of metal material (titanium, copper, aluminum) similar to that of the gate lines and the source lines. Therefore, the terminals 22 to 24 are formed on the array substrate 11b with the known photolithography method at a same time when the gate lines or the source lines are formed with patterning in a process of manufacturing the array substrate 11b. An anisotropic conductive film (ACF, anisotropic conductive material) 28 is arranged on the terminals 22 to 24. The driver-side input terminals 25 of the driver 21 are electrically connected to the panel-side input terminals 23 and the driver-side output terminals 26 are electrically connected to the panel-side output terminals 24 via conductive particles 28a contained in the anisotropic conductive film 28. The anisotropic conductive film 28 includes the conductive particles 28a and binder 28b in which the conductive particles 28a are dispersed. Each of the conductive particles 28a includes a metal core (for example, a core made of nickel coated with gold) that is covered with insulating film and the insulating film is broken or melted by heat or pressure. The connection between the terminals 22 to 27 with the anisotropic conductive film 28 is performed by mounting the flexible printed circuit board 13 and the driver 21 on the array substrate 11b with using a mounting apparatus (not illustrated).

Figure 6:
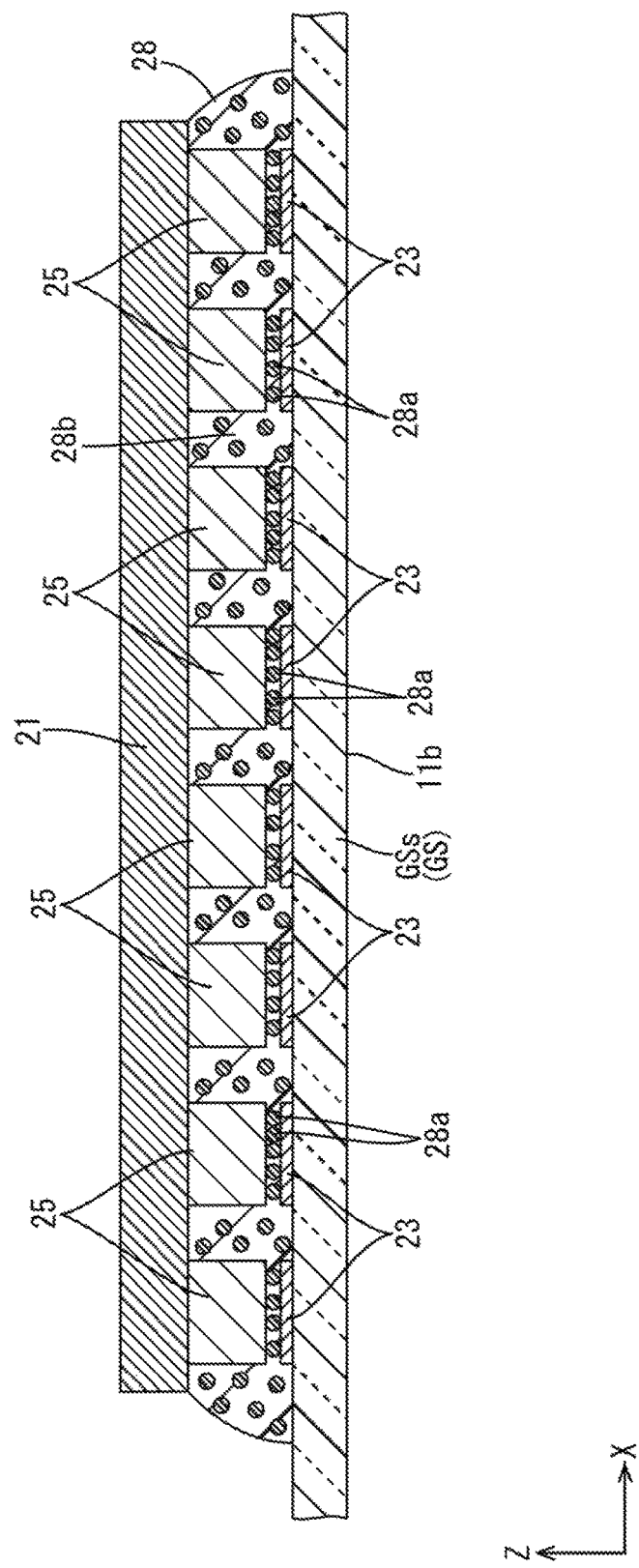
FIG. 6 is a cross-sectional view taken along line B-B in FIG. 4.

As illustrated in FIGS. 4 and 5, the panel-side input terminals 23 and the panel-side output terminals 24 are disposed in a portion of the substrate side portion GSs of the glass substrate GS to be the array substrate 11b overlapping the driver 21 with a plan view, that is, a driver 21-mounting area. A group of the panel-side input terminals 23 and a group of the panel-side output terminals 24 are arranged in the Y-axis direction (in a direction that the mounting components (the driver 21, the flexible printed circuit board 13) and the display area AA are arranged) with a certain distance therebetween. The panel-side input terminals 23 are arranged closer to the flexible printed circuit board 13 (on an opposite side from a display area AA side) in the driver 21-mounting area of the array substrate 11b, and the panel-side output terminals 24 are closer to the display area AA (on an opposite side from a flexible printed circuit board 13-side). As illustrated in FIG. 6, the panel-side input terminals 23 are arranged linearly and the panel-side output terminals 24 are arranged linearly in the X-axis direction, that is, in a long-side direction (a longitudinal direction) of the driver 21 with a certain distance therebetween. FIG. 6 illustrates the cross-sectional configuration of the input terminals 23 and 25, and the output terminals 24 and 26 have the similar cross-sectional configuration thereof. The external connection terminals 22 are disposed in a portion of the substrate side portion GSs of the array substrate 11b overlapping the flexible printed circuit board 13 with a plan view, that is, a flexible printed circuit board 13-mounting area. The external connection terminals 22 are arranged in the X-axis direction linearly with a certain distance therebetween similarly to the panel-side input terminals 23 and the panel-side output terminals 24.

As illustrated in FIG. 5, the driver-side input terminals 25 and the driver-side output terminals 26 of the driver 21 are made of metal material having good conductivity such as gold and are metal bumps (projections) that project from a bottom surface (a surface opposite the array substrate 11b) of the driver 21. Each of the driver-side input terminals 25 and the driver-side output terminals 26 is connected to a processing circuit included in the driver 21. Input signals are input via the driver-side input terminals 25 and processed with the processing circuit and the processed signals are output to the driver-side output terminals 26. As illustrated in FIG. 6, similarly to the panel-side input terminals 23 and the panel-side output terminals 24, the driver-side input terminals 25 are arranged linearly and the driver-side output terminals 26 are arranged linearly in the X-axis direction, that is, in a long-side direction of the driver 21, with a certain distance therebetween. The flexible printed circuit board-side terminals 27 are made of metal material and arranged on a mounting surface of the flexible printed circuit board 13 and are arranged linearly in the X-axis direction with a certain distance therebetween similarly to the driver-side input terminals 25 and the driver-side output terminals 26.

In mounting the driver 21 and the flexible printed circuit board 13 on the array substrate 11b having the above configuration, positions of the mounting components such as the driver 21 and the flexible printed circuit board 13 are required to be adjusted (alignment, positioning) with respect to the array substrate 11b in a plate surface direction thereof (in the X-axis direction and the Y-axis direction). Therefore, as illustrated in FIG. 4, the array substrate 11b includes alignment marks 29 thereon as indication of alignment. The alignment marks 29 are disposed on the respective corner portions 30 in a pair included in the substrate side portion GSs of the glass substrate GS in the array substrate 11b. The pair of corner portions 30 has an outline that is defined by a first edge portion 11b1 that is an outer peripheral edge portion of the glass substrate GS of the array substrate 11b and parallel to the X-axis direction and a pair of second edge portions 11*b*2 that is the outer peripheral edge portion of the glass substrate GS and parallel to the Y-axis direction and perpendicular to (crosses) the first edge portion 11*b*1. A part of the alignment mark 29 is overlapped with the driver 21 in the X-axis direction and is not overlapped with the driver 21 in the Y-axis direction. A part of the alignment mark 29 is overlapped with the flexible printed circuit board 13 in the Y-axis direction and is not overlapped with the flexible printed circuit board 13 in the X-axis direction. The alignment mark 29 is made of a metal film made of metal material or a transparent electrode film made of transparent electrode material. In using the alignment mark 29 made of metal material, the metal material same as that of the gate lines or source lines disposed on the array substrate 11*b* (titanium, copper, aluminum) is preferably used. Accordingly, the alignment marks 29 can be formed on the array substrate 11*b* with patterning with the known photolithography method at the same time as patterning the gate lines or the source lines in the process of manufacturing the array substrate 11*b*. In using the alignment mark 29 made of transparent electrode material, the transparent electrode material same as that of the pixel electrodes 18 disposed on the array substrate 11*b* (ITO, ZnO) is preferably used. Accordingly, the alignment marks 29 can be formed on the array substrate 11*b* with patterning with the known photolithography method at the same time as patterning the pixel electrodes 18 in the process of manufacturing the array substrate 11*b*.

Figure 7:
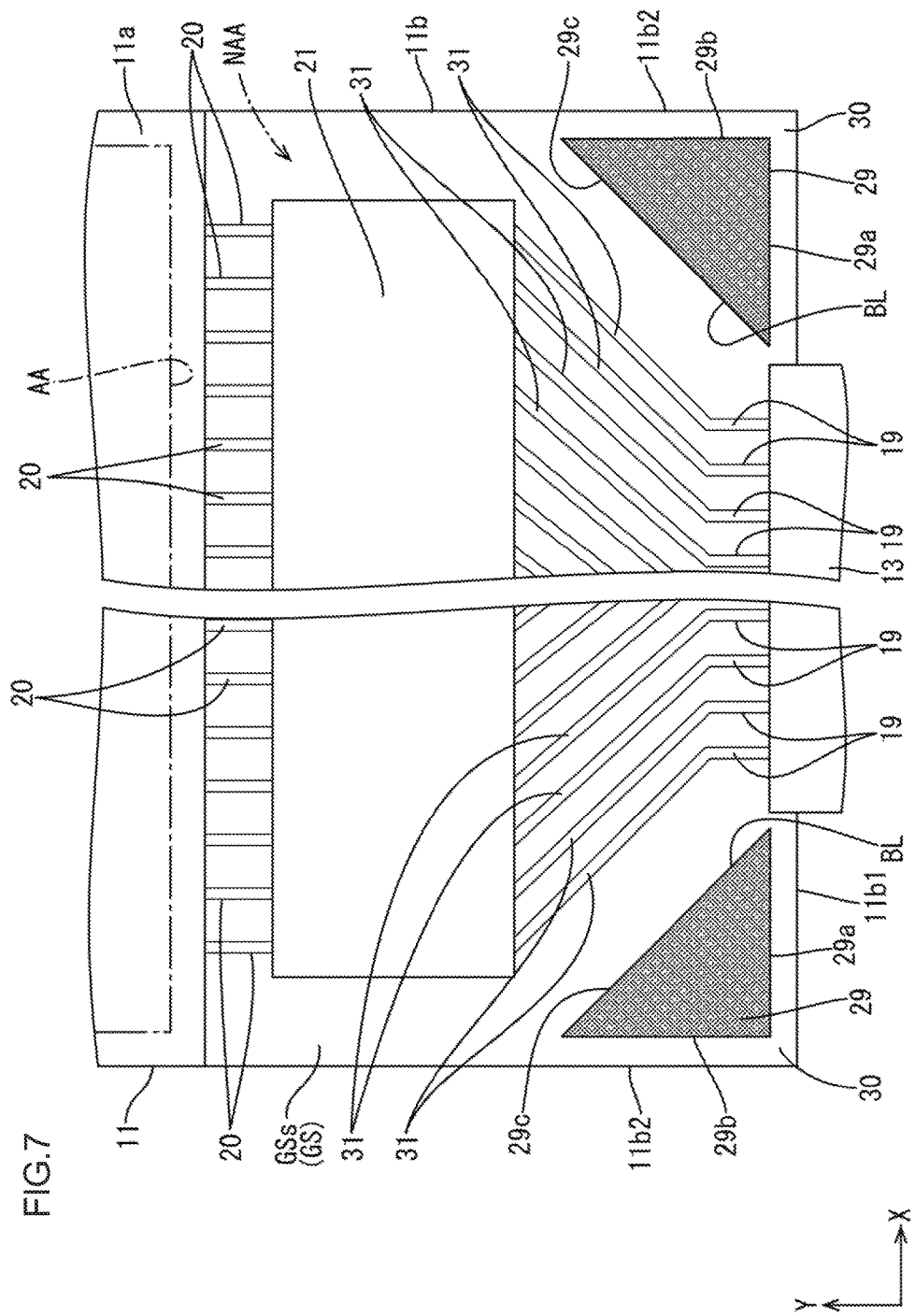
FIG. 7 is a plan view of corner portions of an array substrate.

As illustrated in FIG. 7, the alignment mark 29 includes a first side portion 29*a* that is parallel to the first edge portion 11*b*1 (the X-axis direction) and a second side portion 29*b* that is parallel to the second edge portion 11*b*2 (the Y-axis direction) perpendicular (crossing) the first edge portion 11*b*1. The first side portion 29*a* and the second side portion 29*b* define the outline of the corner portion 30. One end of the second side portion 29*b* is continuous to one end of the first side portion 29*a*. Another ends of the respective first side portion 29*a* and the second side portion 29*b* are linearly connected to each other by a reference line BL. The alignment mark 29*a* has an outline on a same plane as the reference line BL. The reference line BL is inclined with respect to the first side portion 29*a* and the second side portion 29*b*. The alignment mark 29 has an outline defined by the first side portion 29*a*, the second side portion 29*b*, and a third side portion 29*c* that is on a same plane with the reference line BL and inclined with respect to the first side portion 29*a* and the second side portion 29*b*. The alignment mark 29 has a right triangle plan view shape as a whole. Thus, the alignment mark 29 including the first side portion 29*a* parallel to the first edge portion 11*b*1 and the second side portion 29*b* parallel to the second edge portion 11*b*2 is disposed at the corner portion 30 of the array substrate 11*b*. Compared to a configuration that each of the side portions of an alignment mark is not parallel to the edge portions 11*b*1, 11*b*2, the alignment mark 29 can be disposed closer to the first edge portion 11*b*1 and the second edge portion 11*b*2 at the corner portion 30. A space for arranging the alignment mark 29 is reduced and a space for arranging the driver 21 and the flexible printed circuit board 13 is increased, accordingly. Further, the alignment mark 29 has the outline that is on the same plane as the reference line BL connecting the other ends of the respective first side portion 29*a* and the second side portion 29*b*. Therefore, compared to a configuration that an alignment mark has an outline that projects from the reference line BL, the space for arranging the alignment mark 29 is reduced and the space for arranging the driver 21 and the flexible printed circuit board 13 can be increased, accordingly. The third side portion 29*c* of the alignment mark 29 clearly represents the reference line BL.

As illustrated in FIG. 7, the alignment mark 29 is away from the first edge portion 11*b*1 and the second edge portion 11*b*2, respectively, at the corner portion 30 by a predetermined distance. A distance between the first side portion 29*a* and the first edge portion 11*b*1 is equal to a distance between the second side portion 29*b* and the second edge portion 11*b*2. A specific value of the distance is preferably from 0.03 mm to 0.3 mm for the purpose of reducing the frame width. Therefore, the corner portion 30 includes a non-forming area where the alignment mark 29 is not formed and the non-forming area includes first area and a second area and has a substantially L-shaped plan view shape. A belt-like shape having a certain width between the first side portion 29*a* and the first edge portion 11*b*1 is defined as the first area. A belt-like shape having a certain width (same as the width of the first area) between the second side portion 29*b* and the second edge portion 11*b*2 is defined as the second area. The second area is continuous from the first area and the non-forming area is a substantially L-shaped plan view shape as a whole. The first side portion 29*a* and the second side portion 29*b* of the alignment mark 29 have a same length dimension and specific value of the dimension is preferably 0.77 mm as the greatest value for the purpose of reducing the frame width. Accordingly, the alignment mark 29 is an isosceles triangle with a plan view and the third side portion 29*c* is inclined with respect to the first side portion 29*a* and the second side portion 29*b* at a substantially same angle that is approximately 45 degrees. Thus, the arrangement space of the alignment mark 29 is isotropic. A total dimension of the distance between the second side portion 29*b* and the second edge portion 11*b*2 and the length dimension of the first side portion 29*a* is equal to a total dimension of the distance between the first side portion 29*a* and the first edge portion 11*b*1 and the length dimension of the second side portion 29*b*. The specific value of the total dimension is preferably from approximately 0.2 mm to 0.8 mm for the purpose of reducing the frame width.

As illustrated in FIG. 7, the alignment mark 29 is disposed between the driver 21 and the flexible printed circuit board 13 with respect to the Y-axis direction at the corner portion 30 of the substrate side portions GSs of the glass substrate GS of the array substrate 11*b*. The first traces 19 arranged between the driver 21 and the flexible printed circuit board 13 extend substantially straight in the Y-axis direction at the flexible printed circuit board 13 side portions and extend along the reference line BL of the alignment mark 29 with inclined with respect to the X-axis direction (the first side portion 29*a*) and the Y-axis direction (the second side portion 29*b*) at the driver 21 side portions and the driver 21 side portions of the first traces 19 are inclined portions 31. A belt-like area is provided between the reference line BL (the third side portion 29*c*) of the alignment mark 29 and the inclined portion 31 that is adjacent (closest) to the alignment mark 29 and the belt-like area has a constant width and is inclined with respect to the X-axis direction and the Y-axis direction. With the configuration of the first traces 19 including the inclined portions 31, the traces 19 are effectively arranged in the arrangement space provided by the above-described configuration of the alignment mark 29. Specifically, if the first traces 19 are contacted with the alignment mark 29, the resistance of the first traces 19 may be varied and delay may be caused in transmission of the signals. Therefore, a certain clearance is required to be provided between the alignment mark 29 and the first trace 19 that is closest to the alignment mark 29 with considering the resolution of an exposure device used in the photolithography method. The first traces 19 include the inclined portions 31 that are inclined along the reference line BL of the alignment mark 29 and with such a configuration, the above-described certain clearance can be smallest. Accordingly, such a configuration is preferable when the amount of signals transmitted through the first traces 19 and the number of the first traces 19 are increased and the frame width is further reduced according to higher definition and larger screen of the liquid crystal panel 11. The alignment mark 29 has a right triangle plan view shape and the first side portion 29a and the second side portion 29b are parallel to the first edge portion 11b1 and the second edge portion 11b2, respectively, and the third side portion 29c is parallel to the inclined portion. Accordingly, the space required for arranging the alignment mark 29 is reduced and it is preferable to reduce a frame width and enhance definition.

Next, a method of manufacturing a liquid crystal panel 11 (the array substrate 11b) having the above configuration will be described. The method of manufacturing the liquid crystal panel 11 includes at least a structured components forming process, a substrate bonding process, a polarizing plate attachment process, a driver mounting process (mounting process), and a flexible printed circuit board mounting process (the mounting process). In the structured components forming process, metal films and insulation films are layered on an inner plate surface of each glass substrate GS of the CF substrate 11a and the array substrate 11b with the known photolithography method to form various structured components. In the substrate bonding process, the glass substrate GS of the CF substrate 11a and the glass substrate GS of the array substrate 11b are bonded together. In the polarizing plate attachment process, the polarizing plates 11f, 11g are attached to the respective outer plate surfaces of the glass substrates GS. In the driver mounting process (the mounting process), the driver 21 is mounted on the substrate side portion GSs of the glass substrate GS of the array substrate 11b. In the flexible printed circuit board mounting process (the mounting process), the flexible printed circuit board 13 is mounted on the substrate side portion GSs of the glass substrate GS of the array substrate 11b. The driver mounting process and the flexible printed circuit board mounting process further include at least an anisotropic conductive film applying process, an alignment adjustment process (a position adjustment process), a provisional compression bonding process, and a compression bonding process. In the anisotropic conductive film applying process, the anisotropic conductive film 28 is applied on the substrate side portion GSs of the glass substrate of the array substrate 11b. In the alignment adjustment process (a position adjustment process), the positions of the driver 21 and the flexible printed circuit board 13 are adjusted with respect to the position of the array substrate 11b two-dimensionally. In the provisional compression bonding process, the driver 21 and the flexible printed circuit board 13 are placed on the anisotropic conductive film 28 and provisionally pressed. In the compression bonding process, the driver 21 and the flexible printed circuit board 13 are pressed and bonded. Hereinafter, the driver mounting process and the flexible printed circuit board mounting process relating the array substrate 11b will be described in detail.

Figure 8:
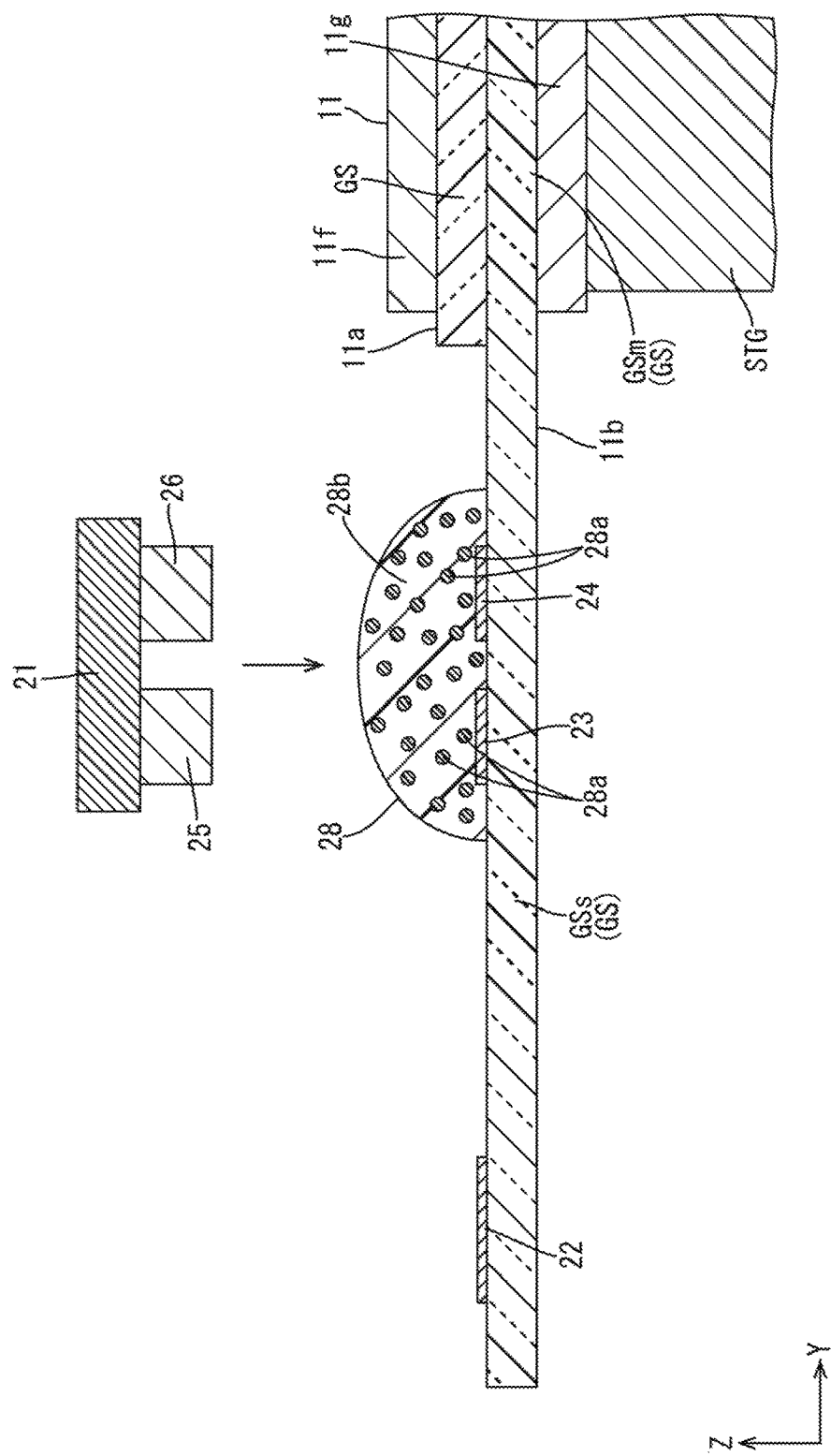
Figure 9:
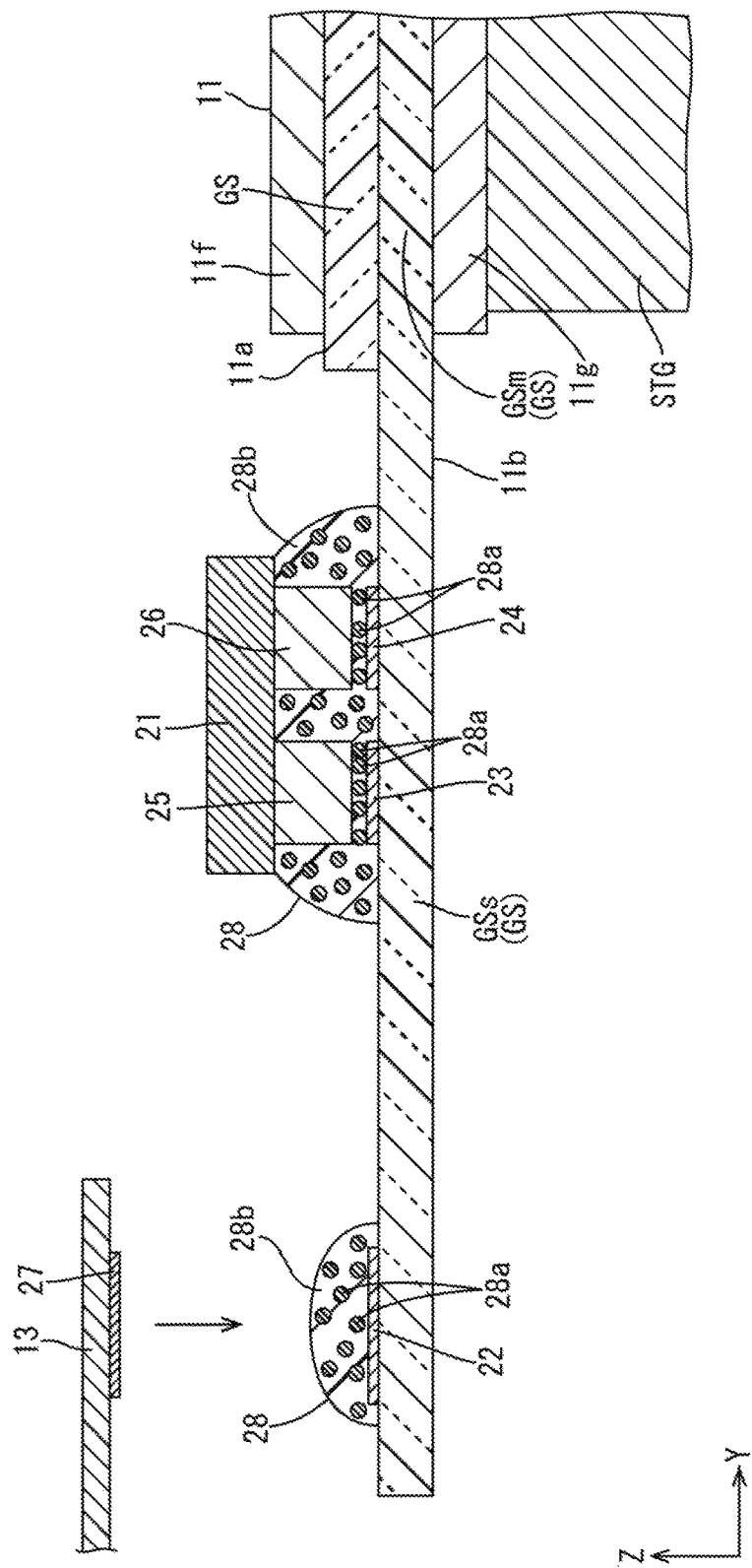
Figure 10:
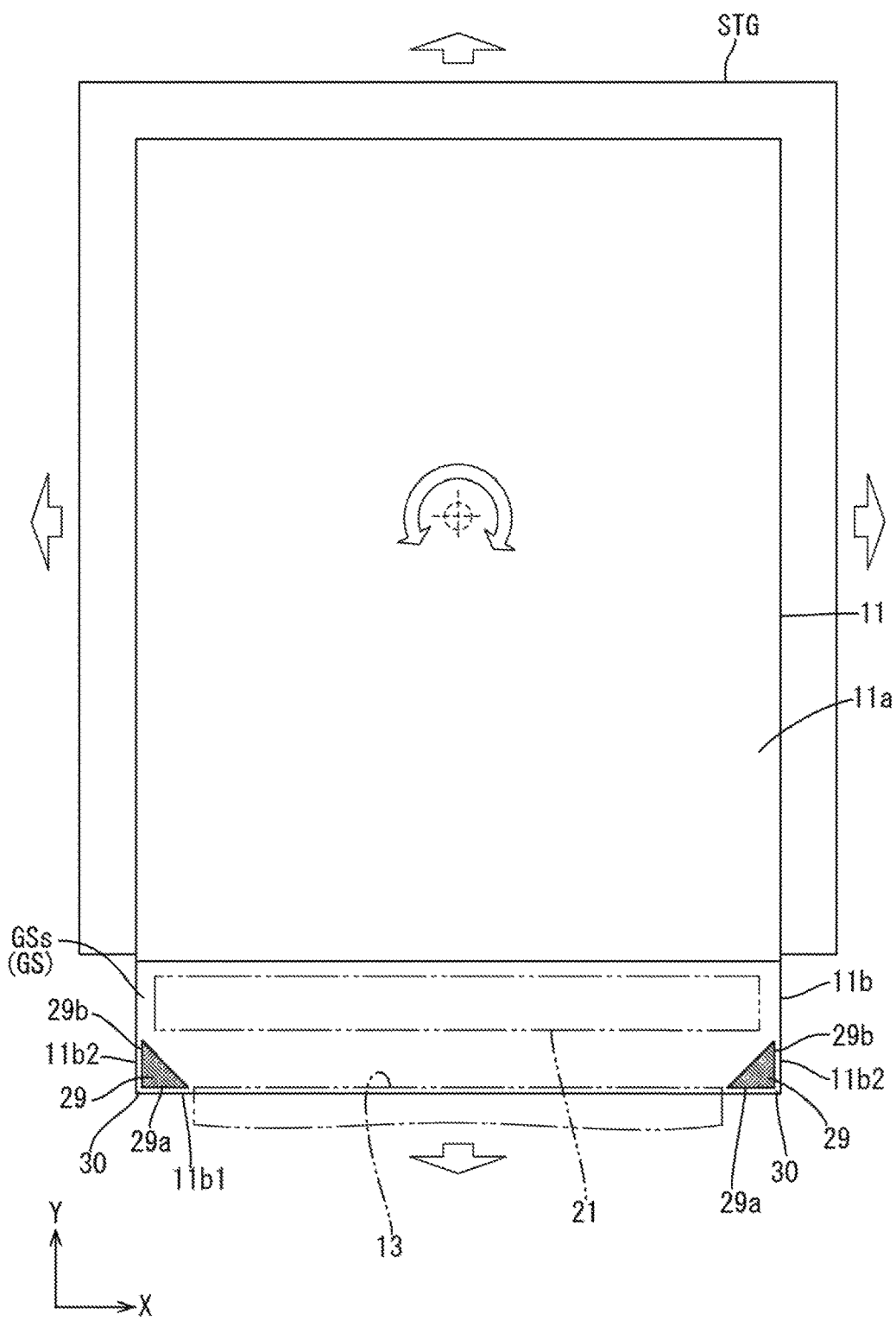
FIG. 10 is a plan view for describing alignment adjustment that is performed in mounting the driver and the flexible printed circuit board.

In the anisotropic conductive film applying process included in the driver mounting process and the flexible printed circuit board mounting process, as illustrated in FIGS. 8 and 9, the anisotropic conductive film 28 is mounted on the driver 21 mounting area or the flexible printed circuit board 13 mounting area in the substrate side portion GSs of the glass substrate GS of the array substrate 11b. In the alignment adjustment process performed prior to the provisional compression bonding process, as illustrated in FIG. 10, the substrate main portion GSm of the glass substrate GS of the array substrate 11b is placed on a stage STG and the stage STG is moved in the X-axis direction, the Y-axis direction and around a center of the array substrate 11b at an angle θ such that the position of the array substrate 11b and the positions of the driver 21 and the flexible printed circuit board 13 to be mounted are adjusted. In the adjustment, the alignment mark 29 is used as an index of alignment adjustment. A pair of alignment marks 29 is disposed at a pair of corner portions 30 of the substrate side portion GSs of the array substrate 11b, respectively. Therefore, alignment is performed with high accuracy and the mounting errors of the driver 21 or the flexible printed circuit board 13 are less likely to be caused. In FIG. 10, the moving directions of the stage STG according to the alignment adjustment are illustrated by arrows and the driver 21 and the flexible printed circuit board 13 to be mounted are illustrated with two-dot chain lines.

In the provisional compression bonding process performed after the alignment adjustment process, the driver 21 or the flexible printed circuit board 13 is placed on the anisotropic conductive film 28 mounted on the substrate side portion GSs and the driver 21 or the flexible printed circuit board 13 is provisionally pressed and bonded on the anisotropic conductive film 28 with a mounting apparatus (not illustrated). In the compression bonding process performed thereafter, the substrate side portion GSs is supported and heated from a rear side thereof by the mounting apparatus (not illustrated) and the driver 21 or the flexible printed circuit board 13 that is provisionally pressed and bonded is pressed and heated from a front side thereof. Accordingly, the driver 21 or the flexible printed circuit board 13 is pressed and bonded. In the compression bonding process, the substrate side portion GSs may not be heated but only the driver 21 or the flexible printed circuit board 13 may be heated, and vice versa.

In manufacturing the CF substrate 11a and the array substrate 11b, structured components are formed on large-sized mother glasses and the mother glasses are bonded together and a bonded mother glass is cut into glass substrates GS for the CF substrates 11a and the array substrates 11b. With such a manufacturing method, in a process of cutting the mother glass (a cutting process), the first side portion 29a and the second side portion 29b of the alignment mark 29 can be used as an index for determining whether cutting positions on the mother glass is correct or not. The third side portion 29c of the alignment mark 29 represents the reference line BL that is parallel to the inclined portions 31 of the first traces 19. It is measured whether the inclined portions 31 of the first traces 19 are parallel to the reference line BL or how the inclined portions 31 are inclined with respect to the reference line BL and it can be determined whether a patterning accuracy of the first traces 19 is allowable or not.

As is described before, the array substrate (the mounting substrate) 11b of the present embodiment includes the glass substrate (substrate) GS where the driver 21 and the flexible printed circuit board 13 that are mounting components are mounted, the alignment mark 29 disposed at the corner portion 30 and used as the positioning index in mounting the driver 21 and the flexible printed circuit board 13, and the first traces 19 (the trace portion) that are connected to the driver 21 and the flexible printed circuit board 13, which are the mounting components. The glass substrate at least includes the corner portion 30 having an outline defined by the first edge portion 11b1 and the second edge portion 11b2 that crosses the first edge portion 11b1. The alignment mark 29 has an outline defined by the first side portion 29a, the second side portion 29b, and an outline that is on a same plane with the reference line BL. The first side portion 29a is parallel to the first edge portion 11b1 and the second side portion 29b is parallel to the second edge portion 11b2 and one end of the second side portion 29b is continuous from one end of the first side portion 29a and the reference line BL connects the other ends of the first side portion 29a and the second side portion 29b linearly. The first traces 19 include at least the inclined portions 31 that are inclined with respect to the first side portion 29a and the second side portion 29b along the reference line BL.

The glass substrate GS on which the driver 21 and the flexible printed circuit board 13, which are the mounting components, are mounted includes the corner portions 30 each having an outline defined by the first edge portion 11b1 and the second edge portion 11b2 that crosses the first edge portion 11b1. The alignment mark 29 is disposed on each of the corner portions 30 and the alignment mark 29 includes at least the first side portion 29a parallel to the first edge portion 11b1 and the second side portion 29b parallel to the second edge portion 11b2 and one end of the second side portion 29b is continuous to one end of the first side portion 29a. With such a configuration, the alignment mark 29 can be disposed closer to the first edge portion 11b1 and the second edge portion 11b2 compared to a configuration that the alignment mark 29 includes the side portions that are not parallel to the respective edge portions. Therefore, a space required for arranging the alignment mark 29 is reduced and accordingly, a space in which the driver 21 and the flexible printed circuit board 13, which are the mounting components, and the first traces 19 can be mounted is increased. Further, the alignment mark 29 has an outline that is on a same plane as the reference line BL that connects the other ends of the respective first side portion 29a and the second side portion 29b linearly or an outline that is recessed from the reference line BL. Therefore, compared to a configuration that the alignment mark has an outline projecting from the reference line BL, the space required for arranging the alignment mark 29 is reduced and accordingly, the space in which the driver 21 and the flexible printed circuit board 13, which are the mounting components, and the first traces 19 can be mounted is increased. The first traces 19 include at least the inclined portions 31 that are inclined with respect to the first side portion 29a and the second side portion 29b along the reference line BL. Therefore, the first traces 19a can be arranged effectively in the space that is prepared by the above configuration of the alignment mark 29, and it is effective in a configuration that the number of the first traces 19 is increased. Thus, the space for arranging the driver 21 and the flexible printed circuit board 13, which are the mounting components, and the first traces 19 can be effectively increased and it is preferable to reduce a frame width of the array substrate 11b and also preferable in a configuration that the amount of signals transmitted with the driver 21 and the flexible printed circuit board 13, which are the mounting components, and the first traces 19 is greatly increased.

The alignment mark 29 has an outline that is on the reference line BL. According to such a configuration, the reference line BL is represented clearly by the outline of the alignment mark 29.

The corner portion 30 has an outline defined by the first edge portion 11b1 and the second edge portion 11b2 that are perpendicular to each other and the alignment mark 29 has a right triangle plan view shape. Accordingly, the space required for arranging the alignment mark 29 can be reduced at the corner portion 30.

The length of the first side portion 29a and that of the second side portion 29b of the alignment mark 29 are equal to each other. Accordingly, the arrangement space of the alignment mark 29 can be isotropic.

The alignment mark 29 is disposed such that the distance between the first edge portion 11b1 and the first side portion 29a is equal to the distance between the second edge portion 11b2 and the second side portion 29b. Accordingly, the arrangement space of the alignment mark 29 can be isotropic.

The glass substrate GS includes a pair of the corner portions 30 and the outlines of the corner portions 30 are defined by the common first edge portion 11b1 and a pair of second edge portions 11b2, respectively. The alignment marks 29 in a pair are disposed on the respective corner portions 30 in a pair. Accordingly, the alignment marks 29 in a pair are disposed on the respective corner portions 30 in a pair that have the outlines defined by the common first edge portion 11b1 and the pair of the second edge portions 11b2. Therefore, the driver 21 and the flexible printed circuit 13, which are the mounting components, are mounted with high alignment accuracy and mounting errors are less likely to be caused.

The flexible printed circuit board 13 is mounted on the glass substrate GS as the mounting component. Accordingly, the flexible printed circuit board 13 can be mounted on the glass substrate GS with high alignment accuracy by the alignment marks 29.

The TFTs (the driven elements) 17 and the driver (the drive circuit portion) 21, which is the mounting component, for driving the TFTs 17 are mounted on the glass substrate GS. Accordingly, the driver 21 can be mounted on the glass substrate GS with high alignment accuracy by the alignment marks 29.

The liquid crystal panel (the display device) 11 according to the present embodiment includes the above-described array substrate 11b, and the CF substrate (the counter substrate) 11a that is bonded to the array substrate 11b with the plate surfaces thereof being opposite each other. Such a liquid crystal panel 11 is preferable to reduce the frame width and enhance definition.

<Second Embodiment>

A second embodiment will be described with reference to FIG. 11. In the second embodiment, a plan view shape of an alignment mark 129 is altered. Similar configurations, operations, and effects to the first embodiment will not be described.

Figure 11:
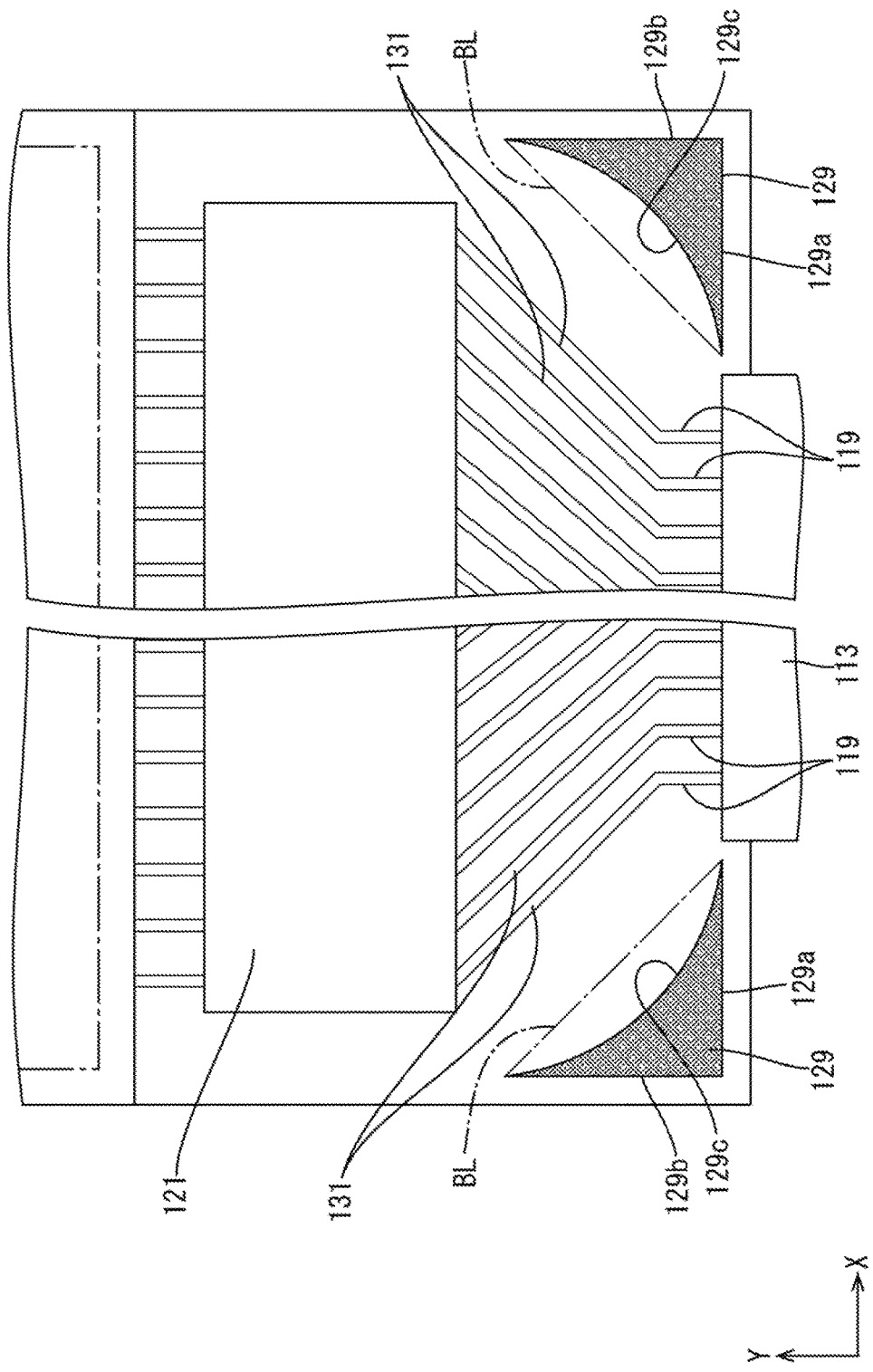
FIG. 11 is an enlarged plan view illustrating corner portions of an array substrate according to a second embodiment of the present technology.

As illustrated in FIG. 11, the alignment mark 129 of the present embodiment has an outline that is recessed from a reference line BL linearly connecting other ends of respective first side portion 129a and second side portion 129b. Namely, the alignment mark 129 has a third side portion 129c that is recessed from the reference line BL toward an opposite side from inclined portions 131 of first traces 119 (toward the first side portion 129a and the second side portion 129b). The alignment mark 129 has the third side portion 129c that is recessed from the reference line BL and has an arched plan view shape. Therefore, the alignment mark 129 tapers toward the other end side of the respective first side portion 129a and second side portion 129b. Therefore, the area and the space required for arranging the alignment mark 129 of the present embodiment is relatively reduced by an arched area surrounded by the reference line BL and the third side portion 120c compared to that of the first embodiment. Thus, the space required for arranging the alignment mark 129 is further reduced and accordingly, the space in which a driver 121, a flexible printed circuit board 113, and first traces 119 can be mounted is increased, and it is preferable for reducing a frame width and increasing definition (increase in the amount of signals). Namely, a distance between the reference line BL of the alignment mark 129 and the inclined portion 131 of the first trace 119 closest to the alignment mark 129 can be smaller than that of the first embodiment. Therefore, the space for arranging the first traces 119 can be increased by the above distance and it is preferable for reducing a frame width and increasing definition. The reference line BL is represented with a chain line in FIG. 11.

According to the present embodiment, as described before, the alignment mark 129 has an outline that is recessed from the reference line BL. According to such a configuration, the space for arranging the driver 121 and the flexible printed circuit board 113, which are the mounting components, and the first traces 119 can be increased by the recessed amount of the outline of the alignment mark 129 from the reference line BL. Therefore, it is preferable for reducing a frame width and increasing the amount of signals. The alignment mark 129 has a recessed portion recessed from the reference line BL and the recessed portion has an arched plan view shape. Accordingly, the alignment mark 129 tapers toward the respective other ends of the first side portion 129a and the second side portions 129b. Therefore, the space for arranging the driver 121 and the flexible printed circuit board 113, which are the mounting components, and the first traces 119 can be increased. Therefore, it is preferable for reducing a frame width and increasing the amount of signals.

<Third Embodiment>

A third embodiment will be described with reference to FIG. 12. In the third embodiment, a plan view shape of an alignment mark 229 is altered from that of the first embodiment. Similar configurations, operations, and effects to the first embodiment will not be described.

Figure 12:
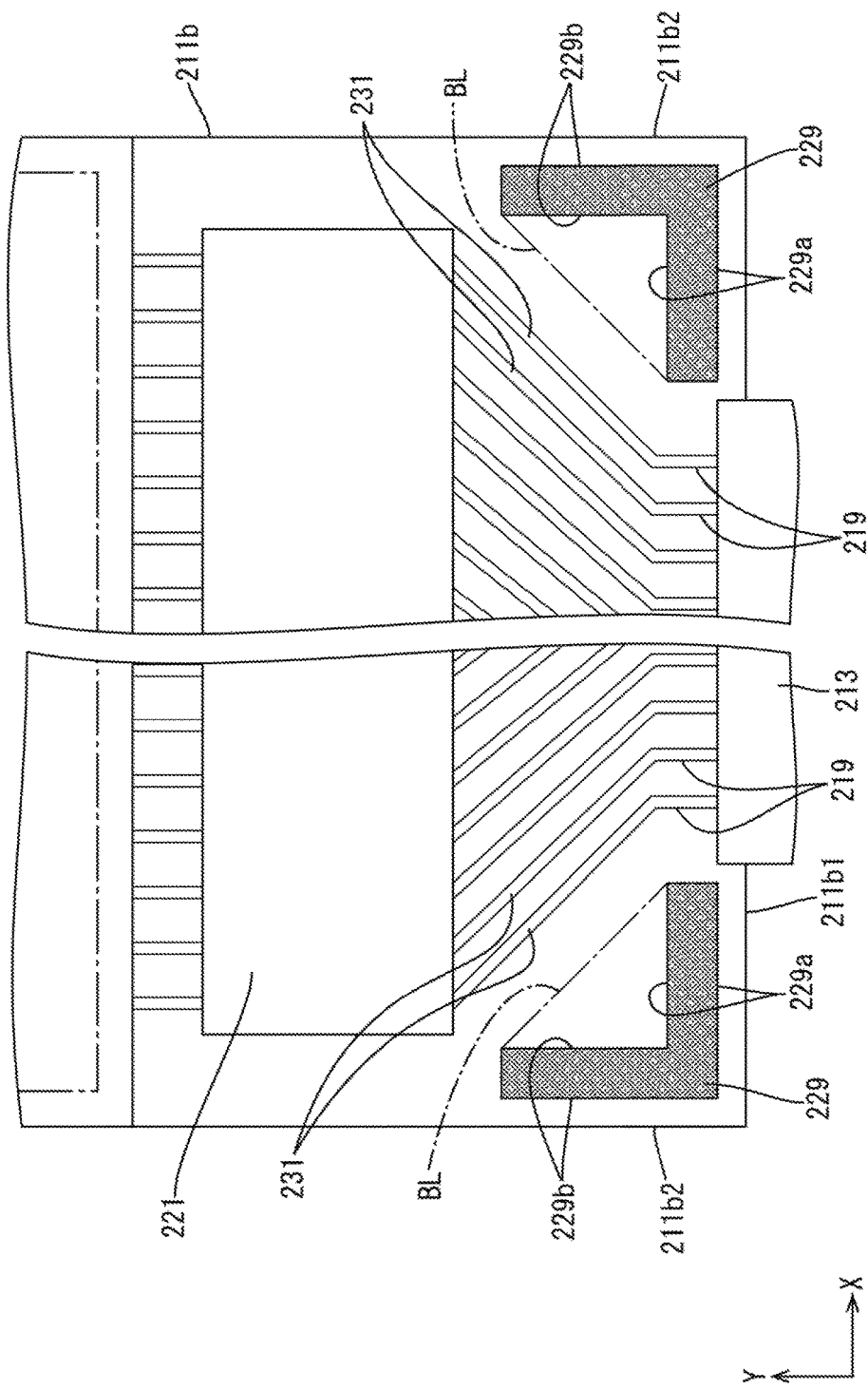
FIG. 12 is an enlarged plan view illustrating corner portions of an array substrate according to a third embodiment of the present technology.

As illustrated in FIG. 12, the alignment mark 229 of the present embodiment has a plan view shape of a substantially L-shape. Namely, the alignment mark 229 includes a pair of first side portions 229a that is parallel to a first edge portion of an array substrate 211b and a pair of second side portions 229b that is parallel to the second edge portion 211b2. The alignment mark 229 has an outline that is recessed from the reference line BL connecting linearly the other ends of the first side portion 229a and the second side portion 229b that are closer to the first traces 219 (the inclined portions 231). The alignment mark 229 includes the first side portion 229a and the second side portion 229b as the recessed portion recessed from the reference line BL. According to such a configuration, the outline of the alignment mark 229 is recessed at most from the reference line BL and the space for arranging a driver 221 and a flexible printed circuit board 213 and the first traces 219 can be increased. Therefore, such a configuration is preferable for reducing a frame width and increasing the amount of signals.

According to the present embodiment, as described above, the recessed portion of the alignment mark 229 recessed from the reference line BL includes the first side portion 229a and the second side portion 229b. According to such a configuration, the outline of the alignment mark 229 is recessed at most from the reference line BL and the space arranging the driver 221 and the flexible printed circuit board 213 and the first traces 219 can be increased. Therefore, such a configuration is preferable for reducing a frame width and increasing the amount of signals.

<Fourth Embodiment>

A fourth embodiment will be described with reference to FIG. 13. In the fourth embodiment, arrangement of a driver 321 is altered from that of the first embodiment. Similar configurations, operations, and effects to the first embodiment will not be described.

As illustrated in FIG. 13, the driver 321 of the present embodiment is arranged such that a part of the driver 321 overlaps the alignment mark 329 also with respect to the Y-axis direction. Accordingly, compared to the configuration of the first embodiment, the driver 321 is arranged closer to the flexible printed circuit board 313 with respect to the Y-axis direction and the space for arranging the driver 321 is increased.

<Fifth Embodiment>

A fifth embodiment will be described with reference to FIG. 14. In the fifth embodiment, arrangement of a driver 421 is altered from that of the second embodiment. Similar configurations, operations, and effects to the second embodiment will not be described.

As illustrated in FIG. 14, the driver 421 of the present embodiment is arranged to be in contact with the reference line BL of an alignment mark 429. Specifically, two corner portions of the driver 421 close to the flexible printed circuit board 413 with respect to the Y-axis direction are overlapped with the respective reference lines BL of the alignment marks 429 in a pair. Accordingly, the driver 421 is arranged closer to the flexible printed circuit board 413 with respect to the Y-axis direction compared to the configuration of the fourth embodiment and the space for arranging the driver 421 is increased.

According to the present embodiment, as described before, at least one of first traces 419, the driver 421 and the flexible printed circuit board 413 is partially overlapped with the reference line BL. Accordingly, an arrangement space is increased by the outline of the alignment mark 429 recessed from the reference line BL and the increased arrangement space is effectively used. Therefore, such a configuration is preferable for reducing a frame width and increasing the amount of signals.

<Sixth Embodiment>

A sixth embodiment will be described with reference to FIG. 15. In the sixth embodiment, arrangement of a driver 521 is altered from that of the third embodiment. Similar configurations, operations, and effects to the third embodiment will not be described.

As illustrated in FIG. 15, the driver 521 of the present embodiment is arranged to cross the reference lines BL of alignment marks 529. Specifically, two corner portions of the driver 521 close to a flexible printed circuit board 513 with respect to the Y-axis direction are overlapped with and cross the respective reference lines BL of alignment marks 529 in a pair. Accordingly, the driver 521 is arranged closer to the flexible printed circuit board 513 with respect to the Y-axis direction compared to the configurations of the fourth embodiment and the fifth embodiment and the space for arranging the driver 521 is increased.

<Seventh Embodiment>

A seventh embodiment will be described with reference to FIG. 16. In the seventh embodiment, a plan-view shape of an alignment mark 629 is altered from that of the first embodiment. Similar configurations, operations, and effects to the first embodiment will not be described.

As illustrated in FIG. 16, the alignment mark 629 of the present embodiment includes a third side portion 629c that is bent with a plan view and accordingly the alignment mark 629 has an outline that is recessed from the reference line BL linearly connecting other ends of a first side portion 629a and a second side portion 629b. Namely, the third side portion 629c of the alignment mark 629 includes a pair of line segments 32 that cross each other with forming a blunt angle. With such a configuration, similarly to the second and third embodiment, the space for arranging the alignment mark 629 can be reduced and accordingly, the space for arranging the driver 621 and the flexible printed circuit board 613, and the first traces 619 can be increased. Therefore, it is preferable for reducing a frame width and increasing definition (the amount of signals).

<Eighth Embodiment>

An eighth embodiment will be described with reference to FIG. 17. In the eighth embodiment, a plan-view shape of an alignment mark 729 is altered from that of the first embodiment. Similar configurations, operations, and effects to the first embodiment will not be described.

As illustrated in FIG. 17, the alignment mark 729 of the present embodiment includes a line segment 33 connecting other ends of first side portions 729a in a pair and a line segment 34 connecting other ends of second side portions 729b in a pair. The alignment mark 729 has an outline such that the line segments 33 and 34 match the reference line BL. Namely, the alignment mark 729 tapers toward the reference line BL at other ends of the respective side portions 729a, 729b. According to such a configuration, compared to the configuration of the third embodiment, the space required for arranging the alignment mark 729 is further reduced and accordingly, the space for arranging a driver 721, a flexible printed circuit board 713 and first traces 719 can be increased. Such a configuration is preferable for reducing a frame width and increasing definition (the amount of signals).

<Other Embodiments>

The present invention is not limited to the embodiment described above with reference to the drawings and the following embodiments may be included in the technical filed of the present invention.

(1) In each of the above embodiments, the alignment mark includes the first side portion and the second side portion having a same length. However, the first side portion and the second side portion of the alignment mark may have different length. The first side portion may be longer than the second side portion, and the first side portion may be shorter than the second side portion.

(2) In each of the above embodiments, the alignment marks are arranged such that the distance between the first edge portion and the first side portion is equal to the distance between the second edge portion and the second side portion. However, the alignment marks may be arranged such that the distance between the first edge portion and the first side portion differs from the distance between the second edge portion and the second side portion. In such a case, the distance between the first edge portion and the first side portion may be greater than the distance between the second edge portion and the second side portion and the distance between the first edge portion and the first side portion may be smaller than the distance between the second edge portion and the second side portion.

(3) In each of the above embodiments, the angle formed by the first edge portion and the second edge portion included in the outer peripheral edge portion of the array substrate is 90 degrees. However, the angle formed by the first edge portion and the second edge portion may be greater than 90 degrees (obtuse angle) or may be smaller than 90 degrees (acute angle). In such a case, the angle formed by the first side portion and the second side portion of the alignment mark may be an obtuse angle or an acute angle (angle other than 90 degrees).

(4) In the second and fifth embodiments, the third side portion of the alignment mark having an arched shape has curvature that may be suitably set.

(5) In the second and fifth embodiments, the third side portion of the alignment mark may have a curved plan view shape (such as a waveform) other than the arched shape.

(6) In the third, sixth, and eighth embodiments, the distance between the first side portions in a pair and the distance between the second side portions in a pair of the alignment mark may be suitably altered.

(7) In the fifth and sixth embodiments, the driver is arranged to be overlapped with the reference line of the alignment mark. However, the driver may be arranged such that the driver may not be overlapped with the reference line and the first trace portions are overlapped with the reference line of the alignment mark. Further, the driver and the first traces may be overlapped with the reference line of the alignment mark.

(8) In the fifth embodiment, the driver is arranged such that the corner portion of the driver is in contact with the reference line of the alignment mark. The driver may be arranged to cross the reference line of the alignment mark similarly to the sixth embodiment with using the alignment mark of the fifth embodiment.

(9) In the seventh embodiment, specific values of the length of the line segments in a pair that are recessed from the reference line and the angle formed by the line segments may be suitably altered.

(10) The driver may be arranged to be in contact with the reference line of the alignment mark or to cross the reference line of the alignment mark similarly to the fifth and sixth embodiments with using the alignment mark of the seventh and eighth embodiments.

(11) Specific plan view shape of the alignment mark may be suitably altered other than those described in each embodiment.

(12) Specific mounting areas (mounting positions) of the driver and the flexible printed circuit board on the array substrate may be suitably altered other than those described in each embodiment.

(13) In each of the above embodiments, the array substrate includes a glass substrate made of glass. However, the array substrate may include a substrate made of synthetic resin (for example, polyimide). In such a configuration, the array substrate and the liquid crystal panel may have flexibility and may be preferably reduced in thickness thereof.

(14) Each of the above embodiments is applied to the light transmissive type liquid crystal display device including the backlight device that is an external light source. The present invention may be applied to a reflection type liquid crystal display device displaying with using external light and in such a configuration, the backlight device may not be included.

(15) In each of the above embodiments, the TFTs are used as the switching components (the driven element) of the liquid crystal panel. However, the technology described herein can be applied to liquid crystal display devices using switching components other than TFTs (e.g., thin film diodes (TFDs)). Furthermore, it can be applied to black-and-white liquid crystal display devices other than the color liquid crystal display device.

(16) In each of the above embodiments, the liquid crystal display device includes the liquid crystal panel as the display panel. The present invention may be applied to display devices using other kinds of display panels (PDP (plasma display panel and organic EL panel).

EXPLANATION OF SYMBOLS

11: liquid crystal panel (display panel), 11*a*: CF substrate (counter substrate), 11*b*, 211*b*: array substrate (mounting substrate), 11*b*1, 211*b*1: first edge portion, 11*b*2, 211*b*2: second edge portion, 13, 113, 213, 313, 413, 513, 613, 713: flexible printed circuit board (a mounting component), 17: TFT a driven element), 19, 119, 219, 619, 719: first traces (a trace portion), 21, 121, 221, 321, 421, 521, 621, 721: driver (mounting component, drive circuit portion), 29, 129, 229, 329, 429, 529, 629, 729: alignment mark, 29*a*, 129*a*, 229*a*, 629*a*, 729*a*: first side portion, 29*b*, 129*b*, 229*b*, 629*b*, 729*b*: second side portion, 30: corner portion, 31, 131, 231: inclined portion, BL: reference line, GS: glass substrate (substrate)

The invention claimed is:

1. A mounting board comprising:
a substrate on which mounting components are to be mounted, the substrate including a corner portion having an outline defined by a first edge portion and a second edge portion that crosses the first edge portion;
an alignment mark disposed on the corner portion and that is an index for positioning when mounting the mounting components,
the alignment mark including at least a first side portion parallel to the first edge portion and a second side portion parallel to the second edge portion, the first side portion having one end and another end, and the second side portion having one end that is continuous to the one end of the first side portion, the second side portion further having another end,
the alignment mark having a reference line connecting the other ends of the first side portion and the second side portion linearly and having an outline that is on a same plane as the reference line or recessed from the reference line; and
traces to be connected to the mounting component, the traces including inclined portions inclined along the reference line and inclined with respect to the first side portion and the second side portion.

2. The mounting board according to claim 1, wherein the alignment mark has the outline that is on the same plane as the reference line.

3. The mounting board according to claim 2, wherein the corner portion has the outline defined by the first edge portion and the second edge portion that are perpendicular to each other, and
the alignment mark has a right triangular plan view shape.

4. The mounting board according to claim 1, wherein the alignment mark has the outline recessed from the reference line.

5. The mounting board according to claim 4, wherein the outline of the alignment mark has a recessed portion recessed from the reference line and the recessed portion has an arched plan view shape.

6. The mounting board according to claim 4, wherein the outline of the alignment mark has a recessed portion recessed from the reference line and the recessed portion includes the first side portion and the second side portion.

7. The mounting board according to claim 4, wherein a part of the traces or a part of the mounting component is overlapped with the reference line.

8. The mounting board according to claim 1, wherein the alignment mark is configured such that the first side portion has a length that is equal to a length of the second side portion.

9. The mounting board according to claim 1, wherein the alignment mark is configured such that a distance between the first edge portion and the first side portion is equal to a distance between the second edge portion and the second side portion.

10. The mounting board according to claim 1, wherein the second edge portion includes second edge portions in a pair and the corner portion of the substrate includes corner portions in a pair and the corner portions have outlines defined by the first edge portion commonly and each of the second edge portions in a pair, and
the alignment mark includes alignment marks in a pair that are disposed on the corner portions in a pair, respectively.

11. The mounting board according to claim 1, wherein the mounting component is a flexible printed circuit board that is mounted on the substrate.

12. The mounting board according to claim 1, wherein driven elements are disposed on the substrate, and the mounting component is a drive circuit portion that drives the driven elements.

13. A display device comprising:
the mounting board according to claim 1; and
a counter substrate bonded on the mounting board such that a plate surface of the counter substrate is opposite a plate surface of the mounting board.

* * * * *